US009764345B2

(12) United States Patent
Kai et al.

(10) Patent No.: US 9,764,345 B2
(45) Date of Patent: Sep. 19, 2017

(54) SUBSTRATE PROCESSING APPARATUS AND NOZZLE CLEANING METHOD

(71) Applicant: Tokyo Electron Limited, Tokyo (JP)

(72) Inventors: Yoshihiro Kai, Kumamoto (JP); Yoshinori Ikeda, Kumamoto (JP); Kazuyoshi Shinohara, Kumamoto (JP); Tetsuya Oda, Kumamoto (JP); Satoru Tanaka, Kumamoto (JP); Yuki Yoshida, Kumamoto (JP); Meitoku Aibara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 349 days.

(21) Appl. No.: 14/291,494

(22) Filed: May 30, 2014

(65) Prior Publication Data
US 2014/0352730 A1 Dec. 4, 2014

(30) Foreign Application Priority Data

May 31, 2013 (JP) ................................ 2013-115904
Nov. 29, 2013 (JP) ................................ 2013-247813

(51) Int. Cl.
H01L 21/67 (2006.01)
C03C 23/00 (2006.01)
B05B 15/02 (2006.01)

(52) U.S. Cl.
CPC ...... B05B 15/0258 (2013.01); C03C 23/0075 (2013.01); H01L 21/6715 (2013.01); H01L 21/67051 (2013.01)

(58) Field of Classification Search
CPC ............ B05B 15/0258; C03C 23/0075; H01L 21/67051; H01L 21/6715
(Continued)

(56) References Cited

U.S. PATENT DOCUMENTS 5,958,517 A * 9/1999 Poag ..................... B05B 15/025
118/302
2001/0004878 A1* 6/2001 Sakai .................. B05B 15/0258
118/70
(Continued)

FOREIGN PATENT DOCUMENTS

JP 2005-205329 A 8/2005
JP 2005-262172 A 9/2005
(Continued)

Primary Examiner — Michael Barr
Assistant Examiner — Tinsae Ayalew
(74) Attorney, Agent, or Firm — Abelman, Frayne & Schwab

(57) ABSTRACT

A substrate processing apparatus according to the present disclosure includes first and second nozzles that eject a processing liquid to a substrate; a moving mechanism that moves the first and second nozzles; and a nozzle cleaning device that cleans at least the second nozzle. The nozzle cleaning device includes a cleaning bath and an overflow bath. The cleaning bath includes a liquid storage portion that stores a cleaning liquid for cleaning the second nozzle, and an overflow portion that discharges the cleaning liquid exceeding a predetermined level from the liquid storage portion. The overflow bath is disposed adjacent to the cleaning bath and receives the cleaning liquid discharged from the overflow portion and discharge the received cleaning liquid to the outside.

13 Claims, 21 Drawing Sheets

(58) Field of Classification Search
USPC .................................................. 134/104.1
See application file for complete search history.

(56) References Cited

U.S. PATENT DOCUMENTS

| | | | |
|---|---|---|---|
| 2006/0011133 A1* | 1/2006 | Nishibayashi | H01L 21/67017 |
| | | | 118/630 |
| 2006/0147620 A1 | 7/2006 | Kwon et al. | |
| 2008/0316251 A1* | 12/2008 | Heo | B41J 2/16552 |
| | | | 347/28 |
| 2010/0051059 A1* | 3/2010 | Kometani | B08B 9/00 |
| | | | 134/21 |

FOREIGN PATENT DOCUMENTS

| JP | 2006-302934 A | 11/2006 |
|---|---|---|
| JP | 2007-258462 A | 10/2007 |

* cited by examiner

SUBSTRATE PROCESSING APPARATUS AND NOZZLE CLEANING METHOD

CROSS-REFERENCE TO RELATED APPLICATIONS

This application is based on and claims priority from Japanese Patent Application Nos. 2013-115904 and 2013-247813, filed on May 31, 2013 and Nov. 29, 2013, respectively, with the Japan Patent Office, the disclosures of which are incorporated herein in their entirety by reference.

TECHNICAL FIELD

The present disclosure relates to a substrate processing apparatus and a nozzle cleaning method.

BACKGROUND

Conventionally, a substrate processing apparatus has been kwon, in which a substrate, such as a semiconductor wafer or a glass substrate, is processed by supplying a processing liquid.

In such a substrate processing apparatus, a processing liquid may be attached to a nozzle itself after the processing liquid is ejected therefrom, and the processing liquid may remain in the nozzle as a contaminant. When a substrate processing is performed in such a state where the nozzle becomes contaminated, the contaminant attached to the nozzle may be scattered, and thus, the substrate may be fouled. Therefore, the substrate processing apparatus may be provided with a nozzle cleaning device in some cases.

For example, Japanese Patent Laid-Open No. 2007-258462 discloses a nozzle cleaning device that removes contaminants attached to a nozzle by spraying a cleaning liquid onto the nozzle.

SUMMARY

A substrate processing apparatus according to an exemplary embodiment of the present disclosure includes first and second nozzles configured to eject a processing liquid to a substrate; a moving mechanism configured to move the first and second nozzles; and a nozzle cleaning device configured to clean at least the second nozzle. The nozzle cleaning device includes a cleaning bath and an overflow bath. The cleaning bath is provided with a liquid storage portion configured to store a cleaning liquid for cleaning at least the second nozzle, and an overflow portion configured to discharge the cleaning liquid exceeding a predetermined level from the liquid storage portion. The overflow bath is disposed adjacent to the cleaning bath and configured to receive the cleaning liquid discharged from the overflow portion and discharge the received cleaning liquid to the outside. When cleaning the second nozzle, the second nozzle is immersed in the cleaning liquid in the liquid storage portion of the cleaning bath, when performing a dummy dispensing processing to eject the processing liquid from the second nozzle, the processing liquid is ejected from the second nozzle into the overflow bath, and when ejecting the processing liquid from the second nozzle into the overflow bath, the first nozzle is disposed in the liquid storage portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
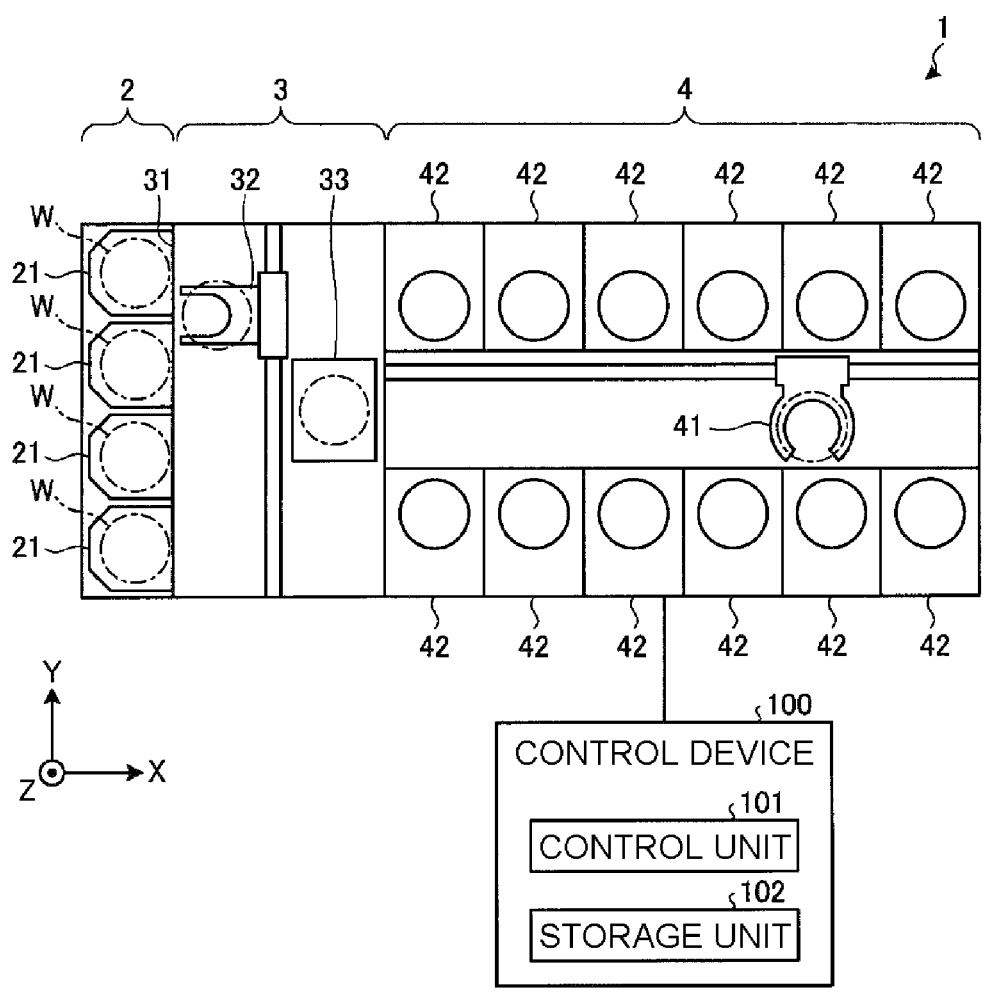
FIG. 1 is a schematic view illustrating a configuration of a substrate processing system according to a first exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

In a case where a method of spraying a cleaning liquid as described in Japanese Patent Laid-Open No. 2007-258462 is adopted, there has been a problem in that uneven cleaning easily occurs in a nozzle. Further, it has been demanded that peripheral devices including a nozzle cleaning device shall not be enlarged.

An object of the present disclosure is to provide a substrate processing apparatus and a nozzle cleaning method which can enhance cleaning performance and facilitating miniaturization.

According to an aspect, the present disclosure provides a substrate processing apparatus including first and second nozzles configured to eject a processing liquid to a substrate; a moving mechanism configured to move the first and second nozzles; and a nozzle cleaning device configured to clean at least the second nozzle. The nozzle cleaning device includes a cleaning bath and an overflow bath. The cleaning bath is provided with a liquid storage portion configured to store a cleaning liquid for cleaning at least the second nozzle, and an overflow portion configured to discharge the cleaning liquid exceeding a predetermined level from the liquid storage portion. The overflow bath is disposed adjacent to the cleaning bath and configured to receive the cleaning liquid discharged from the overflow portion and discharge the received cleaning liquid to the outside. When cleaning the second nozzle, the second nozzle is immersed in the cleaning liquid in the liquid storage portion of the cleaning bath, when performing a dummy dispensing processing to eject the processing liquid from the second nozzle, the processing liquid is ejected from the second nozzle into the overflow bath, and when ejecting the processing liquid from the second nozzle into the overflow bath, the first nozzle is disposed in the liquid storage portion.

The above-mentioned substrate processing apparatus further includes a dummy dispensing bath configured to receive the processing liquid ejected from the first nozzle and discharge the received processing liquid. The overflow bath receives the processing liquid ejected from the second nozzle and discharges the received processing liquid.

In the above-mentioned substrate processing apparatus, the overflow bath is provided at a position where the second nozzle is disposed when the first nozzle is disposed in the liquid storage portion, and the dummy dispensing bath is provided at a position where the first nozzle is disposed when the second nozzle is disposed in the liquid storage portion.

In the above-mentioned substrate processing apparatus, the cleaning bath further includes a dummy dispensing bath side overflow portion configured to discharge the cleaning liquid exceeding the predetermined level from the liquid storage portion to the dummy dispensing bath.

In the above-mentioned substrate processing apparatus, the liquid storage portion in the cleaning bath is formed to have a size capable accommodating the first nozzle and the second nozzle at the same time.

The above-mentioned substrate processing apparatus further includes a cleaning liquid supply unit configured to supply the cleaning liquid into the liquid storage portion. The liquid storage portion is provided with a first inner peripheral portion having an inner dimension which is constant from an upper end to a lower end of the first inner peripheral portion, and a second inner peripheral portion having an upper end and a lower end, the upper end being connected to the lower portion of the first inner peripheral portion, and a diameter of the second inner peripheral portion being gradually reduced from the upper end to the lower end of the second inner peripheral portion. The cleaning liquid supply unit forms a swirling flow in the liquid storage portion by ejecting the cleaning liquid towards a position deviated from the center of the first inner peripheral portion when viewed from above.

In the above-mentioned substrate processing apparatus, the cleaning bath further includes a discharge port configured to discharge the cleaning liquid stored in the liquid storage portion, in the lower end of the second inner peripheral portion, and the discharge port is disposed at a position deviated from the center of the first inner peripheral portion when viewed from above.

In the above-mentioned substrate processing apparatus, before cleaning the nozzle, the liquid storage portion is cleaned by supplying the cleaning liquid into the liquid storage portion of the cleaning bath, and discharging the cleaning liquid exceeding the predetermined level from the liquid storage portion to the overflow portion.

According to another aspect, the present disclosure provides a nozzle cleaning method including: a first moving process of moving a second nozzle that ejects a processing liquid to a substrate into a liquid storage portion of a cleaning bath provided with the liquid storage portion configured to store a cleaning liquid for cleaning the second nozzle, and an overflow portion configured to discharge the cleaning liquid exceeding a predetermined level from the liquid storage portion; an immersing process of immersing the second nozzle in the cleaning liquid stored in the liquid storage portion; a second moving process of moving the second nozzle to an overflow bath disposed adjacent to the cleaning bath and configured to receive the cleaning liquid discharged from the overflow portion and discharge the received cleaning liquid to the outside and disposing a first nozzle in the liquid storage portion; and a dummy dispensing process of ejecting the processing liquid from the second nozzle into the overflow bath.

The above-mentioned nozzle cleaning method further includes a third moving process of moving the first nozzle to a dummy dispensing bath configured to receive a processing liquid discharged from the first nozzle and discharge the received processing liquid; and a second dummy dispensing process of ejecting the processing liquid from the first nozzle into the dummy dispensing bath after the third moving process.

In the above-mentioned nozzle cleaning method, the processing liquid is ejected from the first nozzle at the time of the dummy dispensing process.

The above-mentioned nozzle cleaning method further includes, before the first moving process, a bath cleaning process of cleaning the liquid storage portion by supplying the cleaning liquid into the liquid storage portion of the cleaning bath and discharging the cleaning exceeding a predetermined level from the liquid storage portion to the overflow portion.

According to an aspect of the exemplary embodiment, it is possible to enhance cleaning performance and facilitate miniaturization.

Hereinafter, exemplary embodiments of a substrate processing apparatus and a nozzle cleaning method of the present disclosure will be described in detail with reference to the accompanying drawings. Further, it is noted that the present disclosure is not limited to the exemplary embodiments described below.

First Exemplary Embodiment

<1-1. Configuration of Substrate Processing System>

First, the configuration of a substrate processing system according to a first exemplary embodiment will be described with reference to FIG. 1. FIG. 1 is a schematic view illustrating a configuration of a substrate processing system according to the first exemplary embodiment. In the following, in order to clarify positional relationships, the X-axis, Y-axis and Z-axis which are orthogonal to each other will be defined. The positive (+) Z-axis direction will be regarded as a vertically upward direction.

As illustrated in FIG. 1, a substrate processing system 1 is provided with a substrate carry-in/out unit 2, a substrate transfer unit 3, and a substrate processing unit 4. The substrate carry-in/out unit 2, the substrate transfer unit 3, and the substrate processing unit 4 are connected in the order of the substrate carry-in/out unit 2, the substrate transfer unit 3 and the substrate processing unit 4 in the positive X-axis direction.

The substrate carry-in/out unit 2 is a processing unit configured to arrange and carry-in/out a plurality (e.g., 25 sheets) of substrates W. In the substrate carry-in/out unit 2, for example, four carriers 21 are placed side by side in close contact with a front wall 31 of the substrate transfer unit 3.

The substrate transfer unit 3 is disposed adjacent to the substrate carry-in/out unit 2 and provided with a substrate transfer device 32 and a substrate delivery table 33 therein. The substrate transfer device 32 transfers the substrates W between the carriers 21 and the substrate delivery table 33.

The substrate processing unit 4 is disposed adjacent to the substrate transfer unit 3. The substrate processing unit 4 is provided with a substrate transfer device 41 and a plurality of substrate processing apparatuses 42. The substrate processing apparatuses 42 are disposed side by side along the moving direction of the substrate transfer device 41. The substrate transfer device 41 transfers the substrates W between the substrate delivery table 33 and the substrate processing apparatuses 42. And, the substrate processing apparatuses 42 perform a predetermined chemical liquid processing on the substrates W carried-in by the substrate transfer device 41.

Further, the substrate processing system 1 is provided with a control device 100. The control device 100 is a device configured to control operations of the substrate processing system 1. The control device 100 is, for example, a computer, and includes a control unit 101 and a storage unit 102. The storage unit 102 stores a program that controls various processings such as a nozzle cleaning processing and a dummy dispensing processing to be described below. The control unit 101 controls the operations of the substrate processing system 1 by reading out and executing the program stored in the storage unit 102.

Further, the program may be recorded in a computer-readable recording medium, and installed from the recording medium to the storage unit 102 of the control device 100. The computer-readable recording medium may be, for example, a hard disc (HD), a flexible disc (FD), a compact disc (CD), a magnet optical disc (MO), or a memory card.

<1-2. Configuration of Substrate Processing Apparatus>

Figure 2:
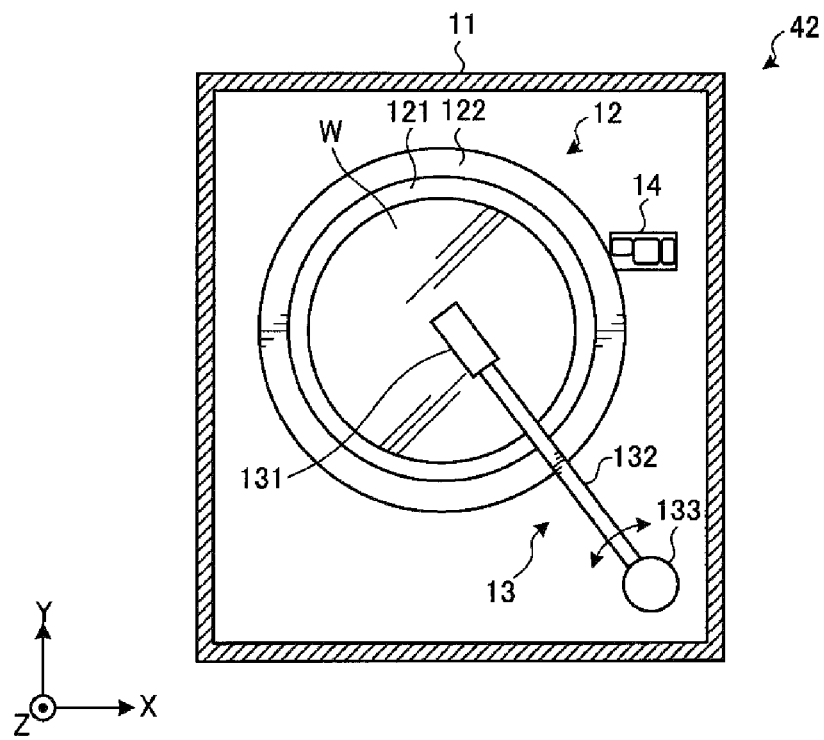
FIG. 2 is a schematic view illustrating a configuration of a substrate processing apparatus according to the first exemplary embodiment.

Next, the configuration of the substrate processing apparatus 42 according to the first exemplary embodiment will be described with reference to FIG. 2. FIG. 2 is a schematic view illustrating a configuration of the substrate processing apparatus 42 according to the first exemplary embodiment.

As illustrated in FIG. 2, the substrate processing apparatus 42 according to the first exemplary embodiment is provided with a substrate holding unit 12, a nozzle unit 13, and a nozzle cleaning device 14 in a processing chamber 11.

The substrate holding unit 12 is provided with a rotating and holding mechanism 121 and a processing liquid recovering mechanism 122. The rotating and holding mechanism 121 holds a substrate W horizontally and rotates the held substrate W around the vertical axis. The processing liquid recovering mechanism 122 receives and recovers a processing liquid scattered outwardly from the substrate W by centrifugal force.

The nozzle unit 13 supplies a processing liquid from the top side of the substrate W held by the rotating and holding mechanism 121 towards the substrate W. The nozzle unit 13 is provided with a nozzle head 131, a nozzle arm 132 configured to support the nozzle head 131 horizontally, and a moving mechanism 133 configured to allow the nozzle arm 132 to pivot and move up and down.

Figure 3:
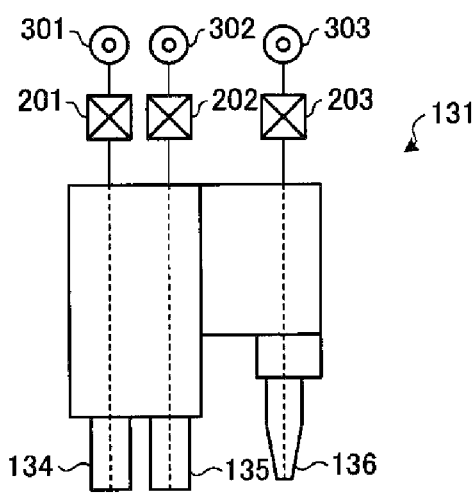
FIG. 3 is a schematic view illustrating a configuration of a nozzle head.

Here, a configuration of the nozzle head 131 will be described with reference to FIG. 3. FIG. 3 is a schematic view illustrating the configuration of a nozzle head 131.

As illustrated in FIG. 3, the nozzle head 131 is provided with three nozzles that eject different kinds of processing liquids, respectively. Specifically, the nozzle head 131 is provided with a first nozzle 134 configured to eject deionized water, a second nozzle 135 configured to eject diluted hydrofluoric acid (DHF) and a third nozzle 136 configured to eject isopropyl alcohol (IPA).

The first nozzle 134 is connected to a deionized water supply source 301 through a valve 201, and the second nozzle 135 is connected to a DHF supply source 302 through a valve 202. Further, the third nozzle 136 is connected to an IPA supply source 303 through a valve 203.

All of the first nozzle 134, the second nozzle 135 and the third nozzle 136 eject processing liquids vertically downwardly. Further, the first nozzle 134, the second nozzle 135, and the third nozzle 136 are disposed side by side in the order of the first nozzle 134, the second nozzle 135, and the third nozzle 136 from the left to the right when viewing the nozzle head 131 along the extending direction of the nozzle arm 132 from the base of the moving mechanism 133 side of the nozzle arm 132. In addition, the first nozzle 134, the second nozzle 135, and the third nozzle 136 are able to move integrally by the moving mechanism 133.

The nozzle cleaning device 14 is a device configured to clean the nozzles 134 to 136 provided in the nozzle unit 13, and disposed at a standby position of the nozzle unit 13 outside the substrate W.

<1-3. Configuration of Nozzle Cleaning Device>

Figure 4:
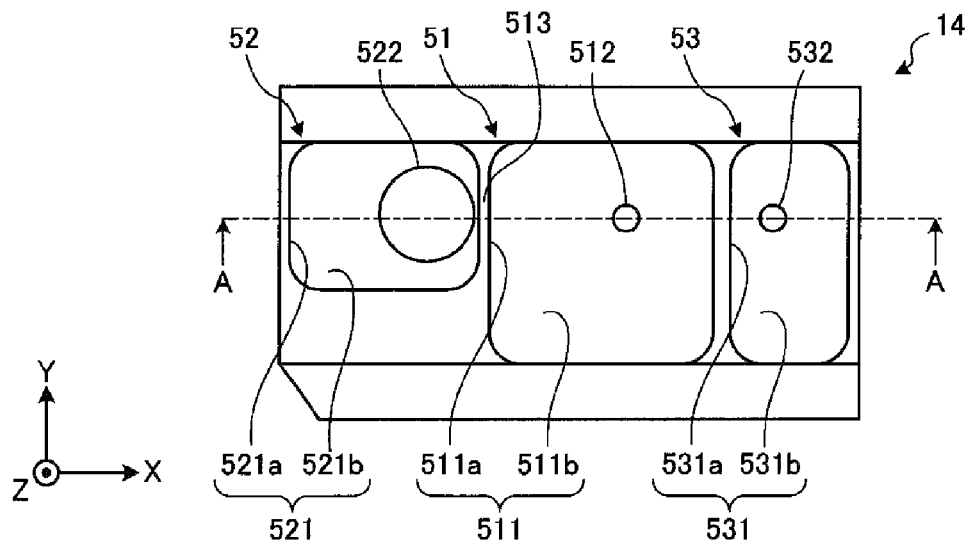
FIG. 4 is a schematic view illustrating a configuration of a nozzle cleaning device according to the first exemplary embodiment.
Figure 5:
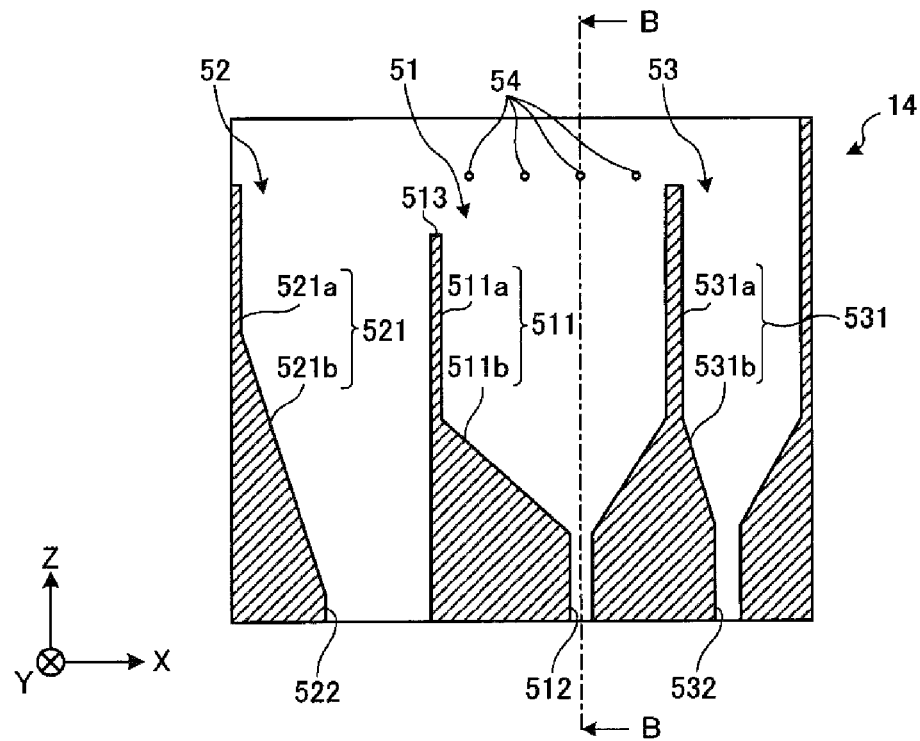
FIG. 5 is a schematic view illustrating a configuration of a nozzle cleaning device according to the first exemplary embodiment.

Next, a configuration of the nozzle cleaning device 14 will be described with reference to FIGS. 4 and 5. FIGS. 4 and 5 are schematic views illustrating the configuration of a nozzle cleaning device 14 according to the first exemplary embodiment. Specifically, FIG. 4 is a schematic plan view of the nozzle cleaning device 14, and FIG. 5 is a cross-sectional view taken along a line A-A in FIG. 4.

As illustrated in FIG. 4, the nozzle cleaning device 14 is provided with a cleaning bath 51, an overflow bath 52, and a dummy dispensing bath 53, which are disposed adjacent to each other in the order of the overflow bath 52, the cleaning bath 51, and the dummy dispensing bath 53 in the positive X-axis direction.

<1-3-1. Cleaning Bath>

The cleaning bath 51 is provided with a liquid storage portion 511 configured to store a cleaning liquid for cleaning the nozzles 134 to 136, and a discharge port 512 configured to discharge the cleaning liquid stored in the liquid storage portion 511. The cleaning liquid is, for example, deionized water at room temperature (e.g., 20° C.). Further, the cleaning liquid may be deionized water heated to a predetermined temperature (about 45° C. to 80° C.) higher than room temperature in order to enhance a cleaning power.

As illustrated in FIG. 5, the liquid storage portion 511 is provided with a first inner peripheral portion 511a where the internal dimension is constant from an upper end to a lower end, and a funnel-shaped second inner peripheral portion 511b where the upper end is connected to the lower end of the first inner peripheral portion 511a and the diameter is gradually reduced from the upper end to the lower end. And, the discharge port 512 is provided in the lower end of the second inner peripheral portion 511b.

A cleaning liquid supply unit configured to supply the cleaning liquid to the liquid storage portion 511 is provided inside the liquid storage portion 511. Further, gas supply units 54 configured to dry the nozzles 134 to 136 after cleaning are provided above the liquid storage portion 511.

Figure 6:
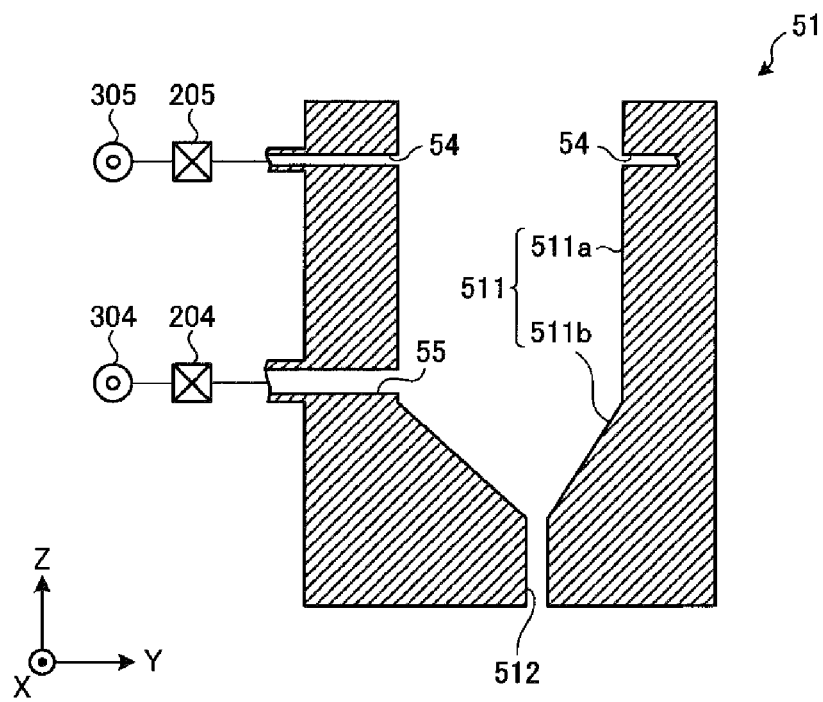
FIG. 6 is a schematic view illustrating a configuration of a cleaning liquid supply unit and gas supply units.
Figure 7:
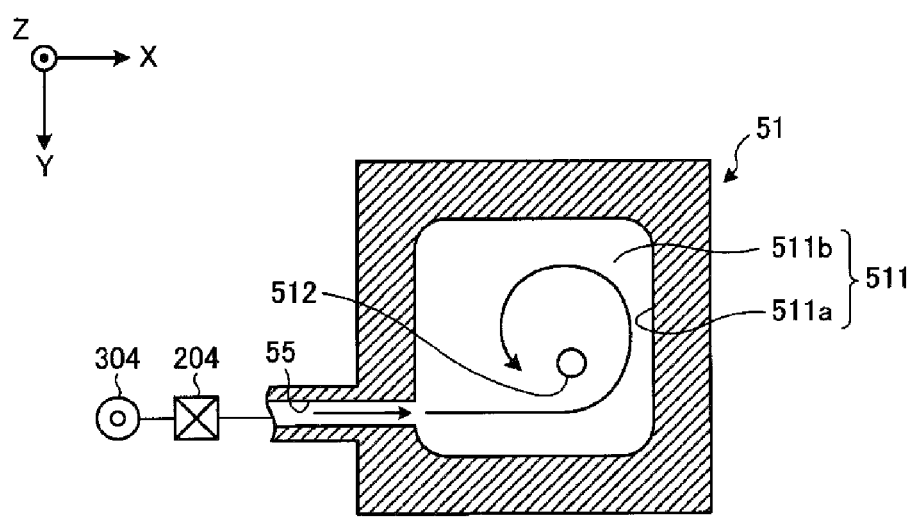
FIG. 7 is a schematic view illustrating a configuration of the cleaning liquid supply unit.
Figure 8:
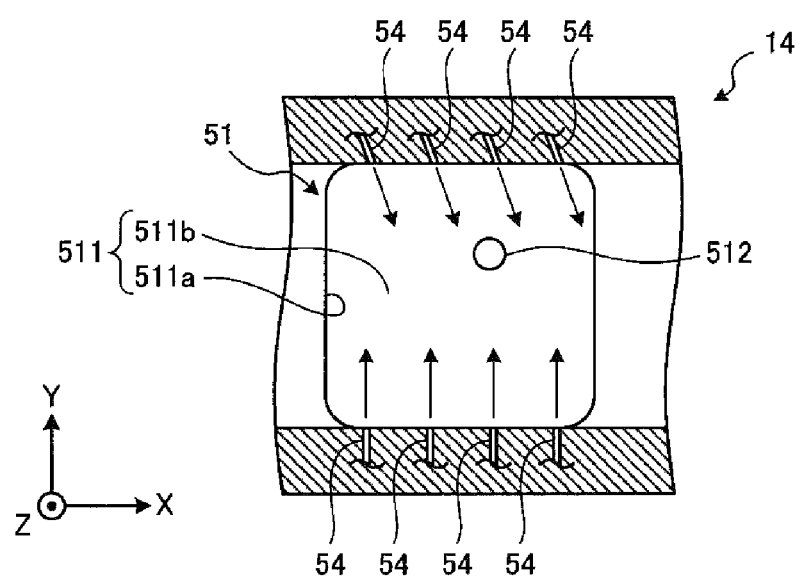
FIG. 8 is a schematic view illustrating a configuration of the gas supply units.

Here, the configuration of the cleaning liquid unit and the gas supply units 54 will be described with reference to FIGS. 6 to 8. FIG. 6 is a schematic view illustrating a configuration of the cleaning liquid supply unit and the gas supply units 54. FIG. 7 is a schematic view illustrating a configuration of the cleaning liquid supply unit. FIG. 8 is a schematic view illustrating a configuration of the gas supply units 54. Further, FIG. 6 is a cross-sectional view taken along a line B-B in FIG. 5.

As illustrated in FIG. 6, the cleaning liquid supply unit 55 is provided in the vicinity of the upper portion of the second inner peripheral portion 511b in the liquid storage portion 511. The cleaning liquid supply unit 55 is connected to a cleaning liquid supply source 304, and supplies the cleaning liquid supplied from the cleaning liquid supply source 304 to the liquid storage portion 511 through a valve 204.

The cleaning liquid supply unit 55 supplies the cleaning liquid to the liquid storage portion 511 in an amount more than that of the cleaning liquid discharged from the discharge port 512. Accordingly, as the cleaning liquid is supplied from the cleaning liquid supply unit 55 to the liquid storage portion 511, the cleaning liquid is stored in the liquid storage portion 511.

As illustrated in FIG. 7, the cleaning liquid supply unit 55 is provided on one side ("first side") of the upper portion of the second inner peripheral portion 511b (the lower portion of the first inner peripheral portion 511a) in a state where it is positioned close to another side ("second side") (here, a side in the positive Y-axis direction) adjacent to the first side, for example, when viewing the cleaning bath 51 from the top.

In addition, the cleaning liquid supply unit 55 supplies the cleaning liquid in a direction along the second side when viewed from above. As a result, while the cleaning liquid supplied from the cleaning liquid supply unit 55 flows the funnel-shaped second inner peripheral portion 511b and reaches the discharge port 512, a swirling flow of the cleaning liquid is formed in the liquid storage portion 511.

Further, when the second inner peripheral portion 511b is viewed from the top, the upper end has a generally rectangular shape and when the second inner peripheral portion 511b is viewed from the bottom, the lower portion has a circular shape. The second inner peripheral portion 511b is formed such that the cross-sectional shape is smoothly changed from the generally rectangular shape to the circular shape towards the lower end from the upper end. As a result, a swirling flow is easily formed in the liquid storage portion 511.

In order to form a swirling flow in the liquid storage portion 511, the cleaning liquid supplied from the cleaning supply unit 55 should consequently flow along the inner peripheral surface of the liquid storage portion 511. That is, the cleaning liquid supply unit 55 may be configured to supply the cleaning liquid towards a position deviated from the center of the first inner peripheral portion 511a at least when viewed from above, and is not limited to the configuration as illustrated in FIGS. 6 and 7.

For example, the cleaning liquid supply unit 55 may be configured to be provided at the center of one side ("first side") of the upper end of the second inner peripheral portion

511*b* (the lower end of the first inner peripheral portion 511*a*) and supply the cleaning liquid obliquely with respect to any side other than the first side, when the cleaning bath 51 is viewed from the top.

Here, a case where the first inner peripheral portion 511*a* has a generally rectangular shape when viewed from the top is exemplified. However, the first inner peripheral portion 511*a* may have, for example, a circular or elliptical shape when viewed from the top.

As illustrated in FIG. 5 or 6, the second inner peripheral portion 511*b* has an eccentric funnel shape. As illustrated in FIG. 7, the discharge port 512 formed in the lower end of the second inner peripheral portion 511*b* is disposed at a position deviated from the center of the first inner peripheral portion 511*a* when the liquid storage portion 511 is viewed from above.

As such, since the discharge port 512 is disposed to be deviated from the center of the first inner peripheral portion 511*a*, the central position of the swirl, which is formed when the cleaning liquid is discharged from the discharge port 512, is deviated from the center of the first inner peripheral portion 511*a*.

As a result, when the nozzles 134 to 136 are cleaned, it is possible to prevent occurrence of air pocket at the tip ends of the nozzles 134 to 136, thereby suppressing uneven cleaning in the tip ends of the nozzles 134 to 136.

Subsequently, the gas supply units 54 will be described. As illustrated in FIG. 6, the gas supply units 54 are provided above the liquid storage portion 511. Specifically, the gas supply units 54 are provided on two walls facing the Y-axis direction of the cleaning bath 51, respectively. On each of the walls, a plurality of gas supply units 54 is disposed side by side horizontally, for example, as illustrated in FIG. 5.

Each of the gas supply units 54 is connected to a gas supply source 305, and ejects gas such as $N_2$, which is supplied from the gas supply source 305 through a valve 205, horizontally.

Specifically, as illustrated in FIG. 8, the gas supply units 54 disposed on the wall surface at the negative side in the Y-axis direction eject the gas straightly in the positive Y-axis direction, that is, toward the wall at the positive side in the Y-axis direction. Meanwhile, the gas supply units 54 disposed at the positive side in the Y-axis direction eject the gas obliquely with respect to the negative Y-axis direction.

Therefore, since the gas ejected from the gas supply units 54 disposed at one side may be prevented from colliding with the gas ejected from the gas supply units 54 disposed at the other side, it is possible be suppress a reduction in air pressure caused by the gases colliding with each other.

<1-3-2. Overflow Bath and Dummy Dispensing Bath>

Next, the configuration of the overflow bath 52 and the dummy dispensing bath 53 will be described. First, the configuration of the overflow bath 52 will be described.

As illustrated in FIGS. 4 and 5, the overflow bath 52 is disposed adjacent to the negative X-axis direction of the cleaning bath 51, and receives and discharges the cleaning liquid overflowing from the cleaning bath 51. The overflow bath 52 is provided with a liquid storage portion 521 and a discharge port 522.

As illustrated in FIG. 5, the liquid storage portion 521 is provided with a first inner peripheral portion 521*a* where the inner dimension is constant from an upper end to a lower end, and a funnel-shaped second inner peripheral portion 521*b* where the upper end is connected to the lower end of the first inner peripheral portion 521*a* and the diameter is gradually reduced from the upper end to the lower end.

Further, the discharge port 522 is provided in the lower end of the second inner peripheral portion 521*b*.

An overflow portion 513 is provided in the upper end of the overflow bath 52 side of the cleaning bath 51. The overflow portion 513 is a portion which is formed lower than other upper ends of the cleaning bath 51. The cleaning liquid exceeding a predetermined level in the cleaning bath 51, that is, the cleaning liquid reaching the overflow portion 513 is discharged from the overflow portion 513 to the overflow bath 52.

Further, the discharge port 522 of the overflow bath 52 is formed to be larger than the discharge port 512 of the cleaning bath 51. Therefore, since the discharge port 512 of the cleaning bath 51 is formed in a smaller size, it is possible to discharge contaminants, which are removed from the nozzles 134 to 136, immediately from the larger discharge port 522 of the overflow bath 52 while facilitating the storage of the cleaning liquid in the liquid storage portion 511.

Subsequently, the configuration of the dummy dispensing bath 53 will be described. The dummy dispensing bath 53 is disposed adjacent to an opposite side to the side of the cleaning bath 51 where the overflow bath 52 is disposed. The dummy dispensing bath 53 is provided with a liquid storage portion 531 and a discharge port 532 as in the cleaning bath 51 and the overflow bath 52.

As illustrated in FIG. 5, the liquid storage portion 531 is provided with a first inner peripheral portion 531*a* where the inner dimension is constant from an upper end to a lower end, and a funnel-shaped second inner peripheral portion 531*b* where the upper end is connected to the lower end of the first inner peripheral portion 531*a* and the diameter is gradually reduced from the upper end to the lower end. The discharge port 532 is provided in the lower end of the second inner peripheral portion 531*b*.

The dummy dispensing bath 53 accommodates the third nozzle 136 (see FIG. 3) during a dummy dispensing processing, and receives and discharges the processing liquid (IPA) ejected from the third nozzle 136. The dummy dispensing processing is a process of appropriately ejecting the processing liquid from the nozzles 134 to 136 on stand-by in which the processing liquid is not ejected to the substrate W, for example, in order to suppress deterioration of the processing liquid.

As such, among the three nozzles 134 to 136 provided in the nozzle head 131, the dummy dispensing processing of the third nozzle 136 is performed in the dummy dispensing bath 53.

Meanwhile, the dummy dispensing processings of the first nozzle 134 and the second nozzle 135 are performed in the overflow bath 52. Accordingly, the overflow bath 52 is also used as a dummy dispensing bath for the first nozzle 134 and the second nozzle 135, which will be described later.

<1-4. Specific Operation of Nozzle Cleaning Device>

<1-4-1. Nozzle Cleaning Processing>

Next, specific operations of the nozzle cleaning device 14 will be described. First, operations of the nozzle cleaning processing will be described with reference to FIGS. 9A to 9G. FIGS. 9A to 9G are schematic views illustrating an operation example of the nozzle cleaning processing according to the first exemplary embodiment.

Further, the nozzle cleaning processing as illustrated in FIGS. 9A to 9G is performed, for example, for every lot, but is not limited thereto. The nozzle cleaning processing may be performed each time when a substrate processing for one substrate W is finished.

Figure 9A:
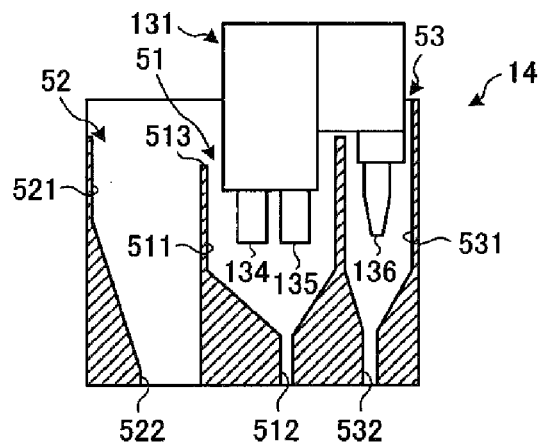
FIG. 9A is a schematic view illustrating an operation example of a nozzle cleaning processing according to the first exemplary embodiment.
Figure 9B:
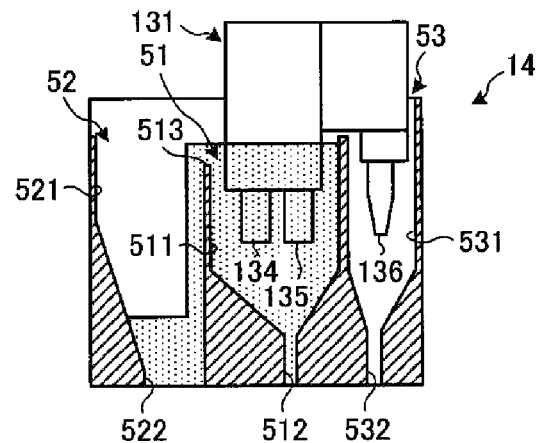
FIG. 9B is a schematic view illustrating an operation example of the nozzle cleaning processing according to the first exemplary embodiment.
Figure 9C:
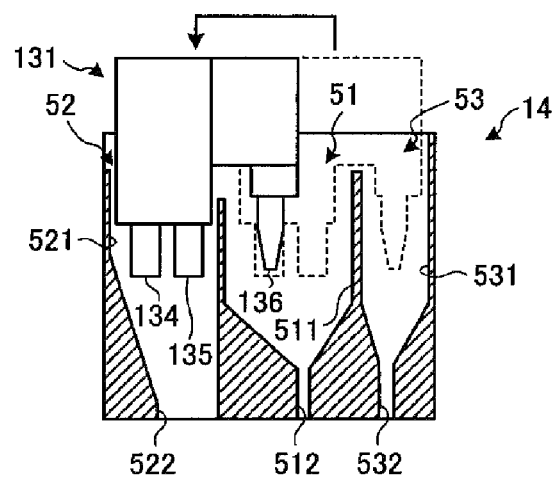
FIG. 9C is a schematic view illustrating an operation example of the nozzle cleaning processing according to the first exemplary embodiment.

First, the control unit 101 (see FIG. 1) controls the moving mechanism 133 (see FIG. 2) to move the nozzle head 131 on the substrate W to the nozzle cleaning device 14 such that the first nozzle 134 and the second nozzle 135 are disposed in the liquid storage portion 511 of the cleaning bath 51 as illustrated in FIG. 9A. At this time, the third nozzle 136 is disposed in the dummy dispensing bath 53.

Subsequently, the control unit 101 opens the valve 204 (see FIG. 6) to supply the cleaning liquid from the cleaning liquid supply unit 55 to the liquid storage portion 511 of the cleaning bath 51. Therefore, the cleaning liquid is stored in the liquid storage portion 511, and the first nozzle 134 and the second nozzle 135 disposed in the liquid storage portion 511 are immersed in the cleaning liquid (see FIG. 9B).

Accordingly, the nozzle cleaning device 14 cleans the first nozzle 134 and the second nozzle 135 by immersing the first nozzle 134 and the second nozzle 135 in the cleaning liquid stored in the liquid storage portion 511. As a result, the first nozzle 134 and the second nozzle 135 may be cleaned evenly from the tip end to the upper portion.

Further, since a swirling flow of the cleaning liquid is formed in the liquid storage portion 511, the cleaning power of the first nozzle 134 and the second nozzle 135 may be enhanced by such a swirling flow.

The cleaning liquid exceeding a predetermined level in the liquid storage portion 511 overflows from the overflow portion 513 to the overflow bath 52 and is discharged from the discharge port 522 of the overflow bath 52 to the outside of the substrate processing apparatus 42.

After a predetermined time elapses from the opening of the valve 204, the control unit 101 closes the valve 204 such that all the cleaning liquid in the liquid storage portion 511 is discharged from the discharge port 512.

Subsequently, the control unit 101 controls the moving mechanism 133 to move the nozzle head 131 such that the third nozzle 136 is disposed in the liquid storage portion 511 of the cleaning bath 51. At this time, the first nozzle 134 and the second nozzle 135 are disposed in the overflow bath 52.

Subsequently, the control unit 101 opens the valve 204 (see FIG. 6) to supply the cleaning liquid from the cleaning liquid supply unit 55 to the liquid storage portion 511 of the cleaning bath 51. Therefore, the cleaning liquid is stored in the liquid storage portion 511, and the third nozzle 136 disposed in the liquid storage portion 511 are immersed and cleaned in the cleaning liquid (see FIG. 9D).

After a predetermined time elapses from the opening of the valve 204, the control unit 101 closes the valve 204 such that all the cleaning liquid in the liquid storage portion 511 is discharged from the discharge port 512.

Subsequently, the control unit 101 opens the valve 205 (see FIG. 6) to eject gas from the gas supply unit 54 and controls the moving mechanism 133 to move the nozzle head 131 up and down (see FIG. 9E). Therefore, the cleaning liquid remaining in the third nozzle 136 is removed or evaporated by the gas from the gas supply unit 54 so that the third nozzle 136 is dried.

Figure 9D:
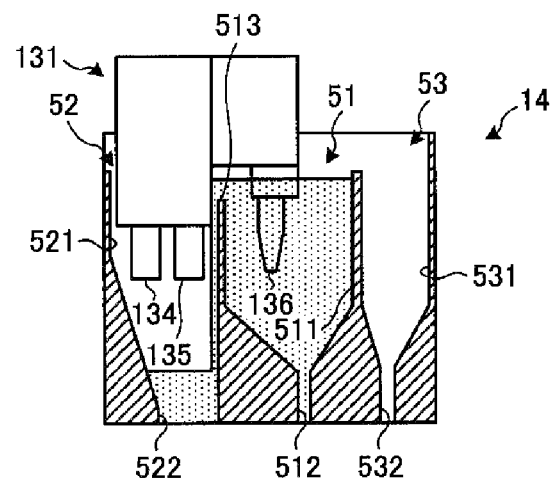
FIG. 9D is a schematic view illustrating an operation example of the nozzle cleaning processing according to the first exemplary embodiment.
Figure 9E:
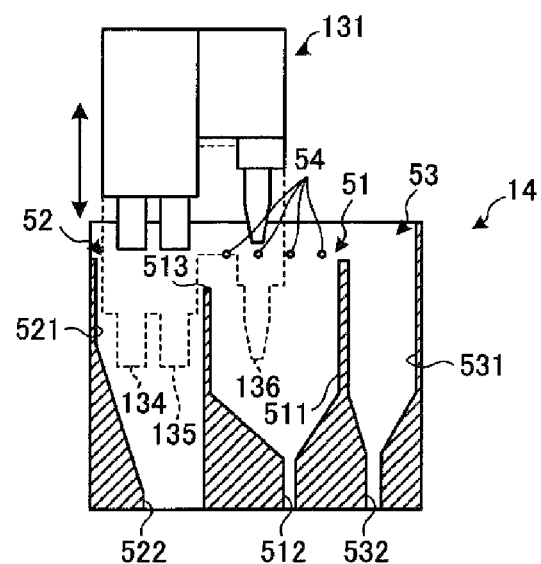
FIG. 9E is a schematic view illustrating an operation example of the nozzle cleaning processing according to the first exemplary embodiment.
Figure 9F:
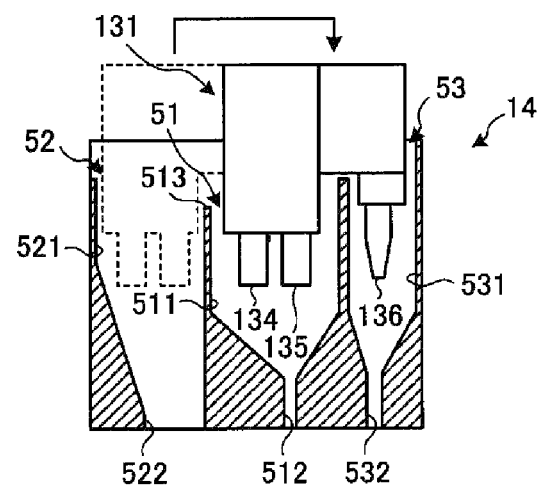
FIG. 9F is a schematic view illustrating an operation example of the nozzle cleaning processing according to the first exemplary embodiment.

Subsequently, the control unit 101 controls the moving mechanism 133 to move the nozzle head 131 such that the first nozzle 134 and the second nozzle 135 are disposed again in the liquid storage portion 511 of the cleaning bath 51, as illustrated in FIG. 9F. Then, the control unit 101 controls the moving mechanism 133 to move the nozzle head 131 up and down (see FIG. 9G), such that the cleaning liquid remaining in the first nozzle 134 and the second nozzle 135 is removed or evaporated by the gas from the gas supply unit 54. As a result, the first nozzle 134 and the second nozzle 135 are dried.

Thereafter, the control unit 101 closes the valve 205 to stop the supply of the gas from the gas supply unit 54, and finish a series of nozzle cleaning processings.

The nozzle head 131 after the nozzle cleaning processing waits at a home position, that is, in a state where the first nozzle 134 and the second nozzle 135 are disposed in the cleaning bath 51 and the third nozzle 136 is disposed in the dummy dispensing bath 53 until the next substrate processing is started.

As described above, the nozzle cleaning apparatus 14 supplies the cleaning liquid from the cleaning liquid supply unit 55 to cleaning bath 51, and immerse and clean the respective nozzles 134 to 136 while allowing the cleaning liquid exceeding a predetermined level to overflow to the overflow bath 52.

Therefore, since contaminants removed from the nozzle 134 to 136 are discharged immediately without staying in the liquid storage portion 511, it is possible to suppress re-attachment of contaminants to the nozzles 134 to 136. Further, since the swirling flow is formed continuously in the liquid storage portion 511, it is possible to maintain a high cleaning power by the swirling flow.

Here, the control unit 101 may perform a pre-processing of temporarily storing HDIW that is a cleaning liquid by supplying HDIW to the liquid storage portion 511 before moving the nozzle head 131 to the nozzle cleaning device 14.

By performing the pre-processing as described above, in the nozzle cleaning device 14, deionized water at a deceased temperature, which remains in a pipe connected to the cleaning liquid supply source 304 and the cleaning liquid supply unit 55, may be discharged before performing a main processing, and deionized water at a predetermined temperature may be supplied immediately at the time of the main processing. Further, the liquid storage portion 511 is warmed by temporarily storing hot deionized water in the liquid storage portion 511. Accordingly, when the hot deionized water is supplied in the liquid storage portion 511 at the time of the main processing, it is possible to suppress the temperature decrease of the supplied deionized water.

<1-4-2. Dummy Dispensing Processing>

Figure 10A:
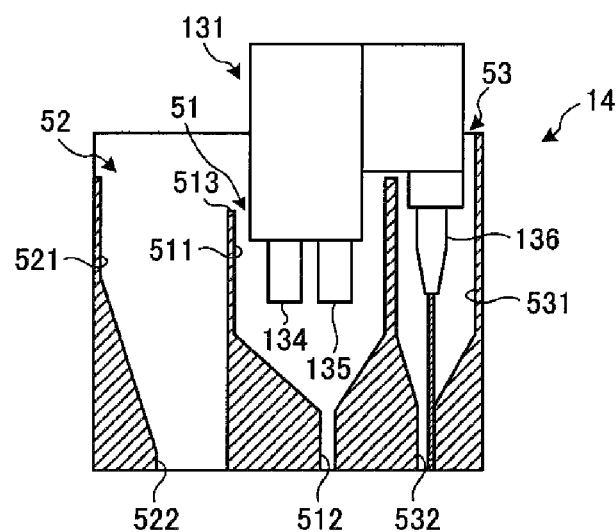
FIG. 10A is a schematic view illustrating an operation example of a dummy dispensing processing according to the first exemplary embodiment.
Figure 10B:
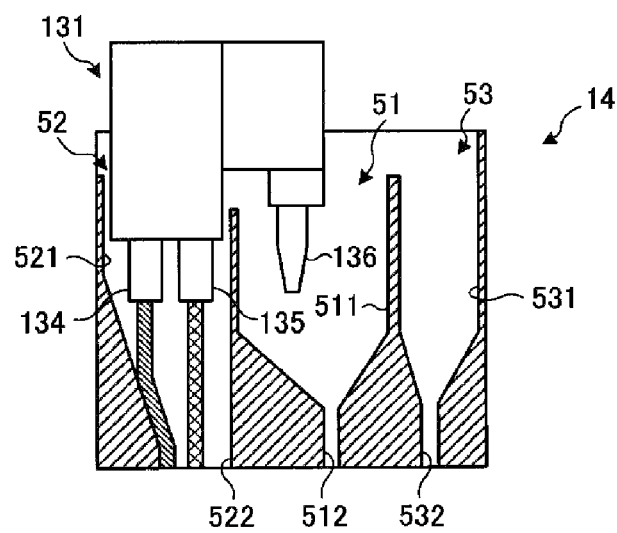
FIG. 10B is a schematic view illustrating an operation example of the dummy dispensing processing according to the first exemplary embodiment.

Next, the operation of the dummy dispensing processing will be described with reference to FIGS. 10A and 10B. FIG. 10A and FIG. 10B are schematic views illustrating an operation example of the dummy dispensing processing according to the first exemplary embodiment. FIG. 10A illustrates an operation example of the dummy dispensing processing of the third nozzle 136, and FIG. 10B illustrates an operation example of the dummy dispensing processing of the first nozzle 134 and the second nozzle 135.

Further, the dummy dispensing processing as illustrated in FIGS. 10A and 10B is performed in a case where predetermined conditions (e.g., the elapsed time from the last dummy dispensing processing) are satisfied, but is not limited thereto. The dummy dispensing processing may be performed each time when the above-mentioned nozzle cleaning processing is finished. By performing the dummy dispensing processing after the nozzle cleaning, it is possible to discharge the cleaning liquid entering the inside of the nozzles 134 to 136 before the next substrate processing.

As illustrated in FIG. 10A, in a case where the dummy dispensing processing of the third nozzle 136 is performed, the control unit 101 controls the moving mechanism 133 (see FIG. 2) to move the nozzle head 131 such that the third nozzle 136 is disposed in the dummy dispensing bath 53. At this time, the first nozzle 134 and the second nozzle 135 are disposed in the cleaning bath 51.

Then, the control unit 101 opens the valve 203 for a predetermined time to eject IPA that is a processing liquid from the third nozzle 136 for a predetermined time. The IPA ejected from the third nozzle 136 is discharged from the discharge port 532 of the dummy dispensing bath 53 to the outside.

Meanwhile, in a case where the dummy dispensing processing of the first nozzle 134 and the second nozzle 135 is performed, the control unit 101 controls the moving mechanism 133 to move the nozzle head 131 such that the first nozzle 134 and the second nozzle 135 are disposed in the overflow bath 52. At this time, the third nozzle 136 is disposed in the cleaning bath 51.

Then, the control unit 101 opens the valve 201 and the valve 202 for a predetermined time to eject deionized water from the first nozzle 134 and DHF from the second nozzle 135 for a predetermined time. The ionized water ejected from the first nozzle 134 and the DHF ejected from the second nozzle 135 are discharged from the discharge port 522 of the overflow bath 52 to the outside.

As described above, in the nozzle cleaning device 14 according to the first exemplary embodiment, the overflow bath 52 that receives and discharges the cleaning liquid overflowing from the cleaning bath 51 is also used as a dummy dispensing bath for the first nozzle 134 and the second nozzle 135. Thus, by sharing the overflow bath and the dummy dispensing bath, it is not necessary to provide a separate dummy dispensing bath. Accordingly, it is possible to facilitate miniaturization of the nozzle cleaning device 14.

Further, since the overflow bath 52 is also used as a dummy dispensing bath, the processing liquid attached to the overflow bath 52 during the dummy dispensing processing may be removed by the cleaning liquid overflowing from the cleaning bath 51 during the nozzle cleaning processing. That is, the cleaning liquid overflowing from the cleaning bath 51 during the nozzle cleaning processing may also be used as a cleaning liquid for cleaning the overflow bath 52 used as a dummy dispensing bath.

Here, the discharge port 522 of the overflow bath 52 is formed to be larger than the discharge port 512 of the cleaning bath 51. However, the discharge port 522 of the overflow bath 52 may be formed as small as the discharge port 512 of the cleaning bath 51. In this way, the overflowing cleaning liquid is easily stored in the overflow bath 52. Thus, it is possible to clean a wider range of the overflow bath 52 using the overflowing cleaning liquid.

Further, the nozzle cleaning device 14 according to the first exemplary embodiment is configured to be provided with the dummy dispensing bath 53 for the dummy dispensing processing of the third nozzle 136 (corresponding to an example of "the first nozzle" in the first exemplary embodiment) ejecting IPA that is an organic processing liquid, separately from the overflow bath 52 for the dummy dispensing processing of the first nozzle 134 and the second nozzle 135 (corresponding to an example of "the second nozzle" in the first exemplary embodiment) ejecting other processing liquids. Thus, it is possible to suppress the IPA from being mixed with other chemical liquids such as DHF.

Here, the dummy dispensing processing is performed after the nozzle cleaning processing is finished. However, the dummy dispensing processing may be performed during the nozzle cleaning processing.

For example, as illustrated in FIG. 9D, the first nozzle 134 and the second nozzle 135 are disposed in the overflow bath 52 during the cleaning of the third nozzle 136. Thus, the dummy dispensing processing of the first nozzle 134 and the second nozzle 135 may be performed during the cleaning of the third nozzle 136.

Figure 9G:
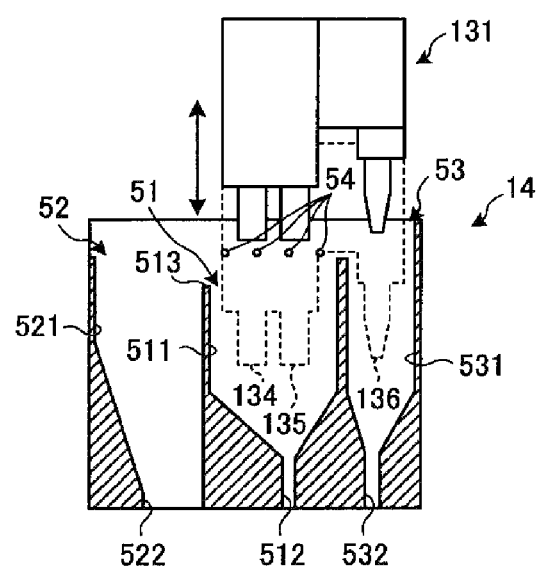
FIG. 9G is a schematic view illustrating an operation example of the nozzle cleaning processing according to the first exemplary embodiment.

Further, as illustrated in FIG. 9F, when the first nozzle 134 and the second nozzle 135 are moved to the liquid storage portion 511 of the cleaning bath 51, the third nozzle 136 is disposed in the dummy dispensing bath 53. Accordingly, after the first nozzle 134 and the second nozzle 135 are moved to the liquid storage portion 511 of the cleaning bath 51, the dummy dispensing processing of the third nozzle 136 may be performed before performing a dry processing of the first nozzle 134 and the second nozzle 135 as illustrated in FIG. 9G or during the dry processing.

As such, when the dummy dispensing processing is performed during the nozzle cleaning processing, it is possible to reduce the time required for the cleaning processing and the dummy dispensing processing.

<1-5. Configuration of Substrate Processing Unit>

Figure 11:
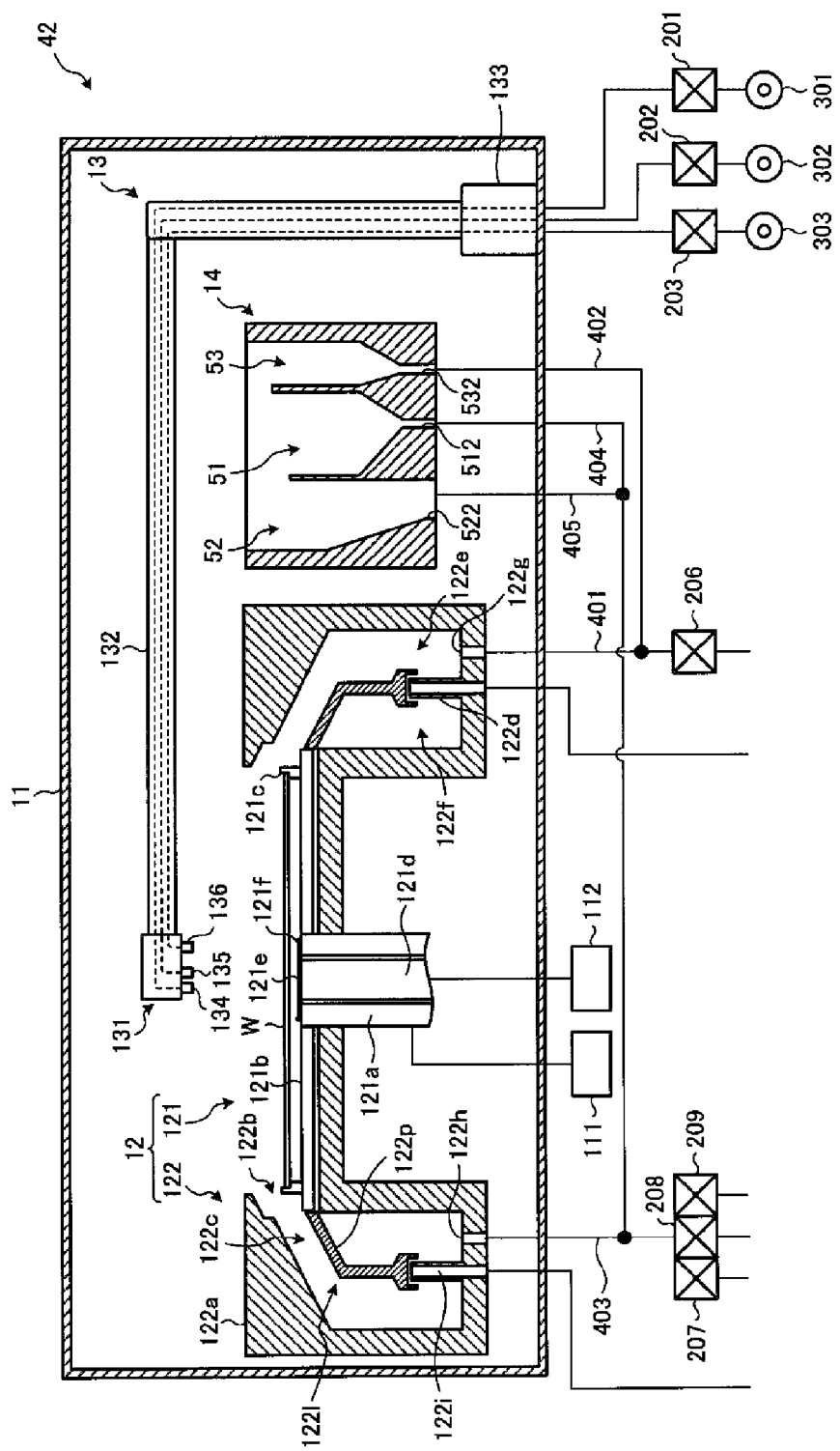
FIG. 11 is a schematic view illustrating the configuration of the substrate processing apparatus according to the first exemplary embodiment.

Next, a piping configuration of the substrate processing apparatus 42 will be described with reference to FIG. 11. FIG. 11 is a schematic view illustrating the configuration of the substrate processing apparatus 42 according to the first exemplary embodiment.

As illustrated in FIG. 11, in the rotating and holding mechanism 121 provided in the substrate holding unit 12, an annular table 121b is horizontally attached to the upper end of a hollow cylindrical rotating shaft 121a. A plurality of substrate holders 121c configured to come into contact with a peripheral portion of a wafer W and hold the wafer W horizontally is attached to be spaced apart from each other in the peripheral portion of the table 121b.

A rotation driving mechanism 111 is connected to the rotating shaft 121a. The rotating shaft 121a and the table 121b are rotated by the rotation driving mechanism 111 to rotate the substrate W held by the substrate holders 121c on the table 121b. The rotation driving mechanism 111 is connected to the control unit 101 (see FIG. 1), and the rotation of the rotation driving mechanism 111 controlled by the control unit 101.

Further, in the substrate holding unit 12, an elevating shaft 121d is inserted onto to the hollow portion in the center of the rotating shaft 121a and the table 121b to be vertically movable, and a disc-shaped elevating plate 121e is attached to the upper end of the elevating shaft 121d. In a peripheral portion of the elevating plate 121e, a plurality of elevating pins 121f configured to come into contact with the bottom of the substrate W and move up and down the substrate W is attached to be spaced apart from each other in the circumferential direction.

An elevation mechanism 112 is connected to the elevating shaft 121d. The elevating shaft 121d and the elevating plate 121e are moved up and down by the elevation mechanism 112 to move up and down the substrate W held by the elevating pins 121f. The elevation mechanism 112 is connected to the control unit 101, and the up-and-down movement of the elevation mechanism 112 is controlled by the control unit 101.

Further, the processing liquid recovering mechanism 122 provided in the substrate holding unit 12 is provided with a recovery cup 122a which surrounds the bottom and the peripheral outside of the substrate W and is opened at the top side above the substrate W. The recovery cup 122a forms a recovery port 122b outside the periphery of the substrate W and a recovery space 122c to be in communication with the recovery port 122b in the lower portion.

Further, the recovery cup 122a forms a concentric ring-shaped partition wall 122d on the bottom of the recovery space 122c to partition the bottom of the recovery space 122c into a first recovery portion 122e and a second recovery portion 122f, which are concentric double ring-shaped. On the bottom of the first recovery portion 122e and the second recovery portion 122f, discharge ports 122g, 122h are formed to be spaced apart from each other in the circumferential direction.

The discharge port 122g is connected to a valve 206 through a drain pipe 401. The chemical liquid (here, IPA) discharged from the discharge port 122g is discharged to the outside of the substrate processing apparatus 42 through the drain pipe 401 and the valve 206.

The drain pipe 401 is connected with a drain pipe 402 connected to the discharge port 532 of the dummy dispensing bath 53 provided in the nozzle cleaning device 14. Thus, the IPA ejected from the third nozzle 136 to the dummy dispensing bath 53 in the dummy dispensing processing is discharged to the outside of the substrate processing apparatus 42 through the drain pipe 402 and the valve 206.

As described above, in the substrate processing apparatus 42, the discharge path of the IPA discharged from the discharge port 122g of the substrate holding unit 12 during the substrate processing is shared with the discharge path of the IPA discharged from the discharge port 532 of the dummy dispensing bath 53 during the dummy dispensing processing.

The discharge ports 122h are connected to valves 207, 208, 209, respectively, through a drain pipe 403. The opening and closing of the valves 207, 208, 209 are controlled by the control unit 101. For example, in a case where an acidic chemical liquid is discharged, the valve 207 is opened by the control unit 101. Thus, the acidic chemical liquid discharged from the discharge ports 122h is discharged to the outside of the substrate processing apparatus 42 through the drain pipe 403 and the valve 207.

Further, in a case where an alkaline chemical liquid is discharged, the valve 208 is opened by the control unit 101 such that the alkaline chemical liquid discharged from the discharge port 122h is discharged to the outside of the substrate processing apparatus 42 through the drain pipe 403 and the valve 208. Further, when recovering the chemical liquid, the valve 209 is opened by the control unit 101 such that the chemical liquid discharged from the discharge port 122h is recovered through the drain pipe 403 and the valve 209.

The drain pipe 403 is connected with a drain pipe 404 connected to the discharge port 512 of the cleaning bath 51 provided in the nozzle cleaning device 14. Further, the drain pipe 404 is connected with a drain pipe 405 connected to the discharge port 522 of the overflow bath 52.

Therefore, the cleaning liquid discharged from the cleaning bath 51 and the overflow bath 52 during the nozzle cleaning processing and the deionized water and DHF discharged from the first nozzle 134 and the second nozzle 135, respectively, during the dummy dispensing processing are discharged to the outside of the substrate processing apparatus 42 through any one of the valves 207 to 209.

As described above, in the substrate processing apparatus 42, the discharge path of the chemical liquid discharged from the discharge port 122h of the substrate holding unit 12 during the substrate processing is shared with the discharge path of the chemical liquids discharged from the cleaning bath 51 and the overflow bath 52 during the dummy dispensing processing.

In the recovery cup 122a, a plurality of exhaust ports 122i is formed to be spaced apart from each other in the circumferential direction above the discharge ports 122g, 122h in the middle portion of the partition wall 122d.

Further, the recovery cup 122a is provided with an elevation cup 122l. The elevation cup 122l is disposed at a space just above the partition wall 122d. The elevation cup 122l is connected with an elevation mechanism (not illustrated) configured to move up and down the elevation cup 122l. The up-and-down movement of the elevation mechanism is controlled by the control unit 101.

The elevation cup 122l is provided with an inclined wall portion 122p inclined inwardly upwardly to the recovery port 122b of the recovery cup 122a in its upper end. The inclined wall portion 122p extends in parallel along the inclined wall of the recovery space 122c to the recovery port 122b of the recovery cup 122a such that the inclined wall portion 122p is in proximity to the inclined wall of the recovery space 122c of the recovery cup 122a.

And, when the elevation cup 122l is moved down by using the elevation mechanism (not illustrated), a flow path flowing from the recovery port 122b to the discharge port 122g of the first recovery portion 122e is formed between the inclined wall of the recovery cup 122a and the inclined wall portion 122p of the elevation cup 122l in the recovery space 122c.

Further, when the elevation cup 122l is moved up by using the elevation mechanism (not illustrated), a flow path flowing from the recovery port 122b to the discharge port 122h inside the inclined wall portion 122p of the elevation cup 122l in the recovery space 122c.

When performing the substrate processing, the substrate processing apparatus 42 moves up or down the elevation cup 122l of the processing liquid recovering mechanism 122 to drain a processing liquid from any one of the discharge ports 122g, 122h depending on the kind of the processing liquid used.

For example, in a case where the substrate W is processed by ejecting DHF that is an acidic processing liquid from the second nozzle 135 to the substrate W, the control unit 101 opens the valve 202 by controlling the rotation driving mechanism 111 to rotate the table 121b of the substrate holding unit 12 at a predetermined rotation speed. Thus, the DHF supplied from the DHF supply source 302 is ejected from the second nozzle 135 to the top surface of the substrate W.

At this time, the control unit 101 controls the elevation mechanism (not illustrated) to move down the elevation cup 122l so as to form a flow path flowing from the recovery port 122b to the discharge port 122g of the first recovery portion 122e.

Accordingly, the DHF supplied to the substrate W is scattered outwardly from the periphery of the substrate W by an action of the centrifugal force caused by the rotation of the substrate W, and recovered from the recovery port 122b of the recovery cup 122a to the first recovery portion 122e of the recovery space 122c.

Further, in a case where the substrate W is processed by ejecting IPA that is an organic processing liquid from the third nozzle 136 to the substrate W, the control unit 101 opens the valve 203 by controlling the rotation driving mechanism 111 to rotate the table 121b of the substrate holding unit 12 at a predetermined rotation speed. Thus, the IPA supplied from the IPA supply source 303 is ejected from the third nozzle 136 to the top surface of the substrate W.

At this time, the control unit 101 controls the elevation mechanism (not illustrated) to move up the elevation cup 122l so as to form a flow path flowing from the recovery port 122b to of the second recovery portion 122f.

Accordingly, the IPA supplied to the substrate W is scattered outwardly from the periphery of the substrate W by an action of the centrifugal force caused by the rotation of the substrate W, and recovered from the recovery port 122b of the recovery cup 122a to the second recovery portion 122f of the recovery space 122c.

As described above, the nozzle cleaning device according to the first exemplary embodiment is provided with the cleaning bath 51, the overflow bath 52, and a control unit 101. The cleaning bath 51 is provided with the liquid storage portion 511 that stores the cleaning liquid and the overflow portion 513 that discharges the cleaning liquid exceeding a predetermined level from the liquid storage portion 511. The overflow bath 52 is disposed adjacent to the cleaning bath 51, and receives and discharges the cleaning liquid discharged from the overflow portion 513, to the outside. The control unit 101 controls the moving mechanism 133 that moves the nozzles 134 to 136. Further, when cleaning the nozzles 134 to 136, the control unit 101 moves the nozzles 134 to 136 to the liquid storage portion of the cleaning bath 51 so as to be immersed in the cleaning liquid stored in the liquid storage portion 511. When performing the dummy dispensing processing of ejecting the processing liquid from the nozzles 134, 135 while waiting, the control unit 101 moves the nozzles 134, 135 to the overflow bath 52 to discharge the processing liquid to the overflow bath 52. Therefore, according to the nozzle cleaning device 14 according to the first exemplary embodiment, it is possible to enhance the cleaning power and facilitate the miniaturization.

Figure 12:
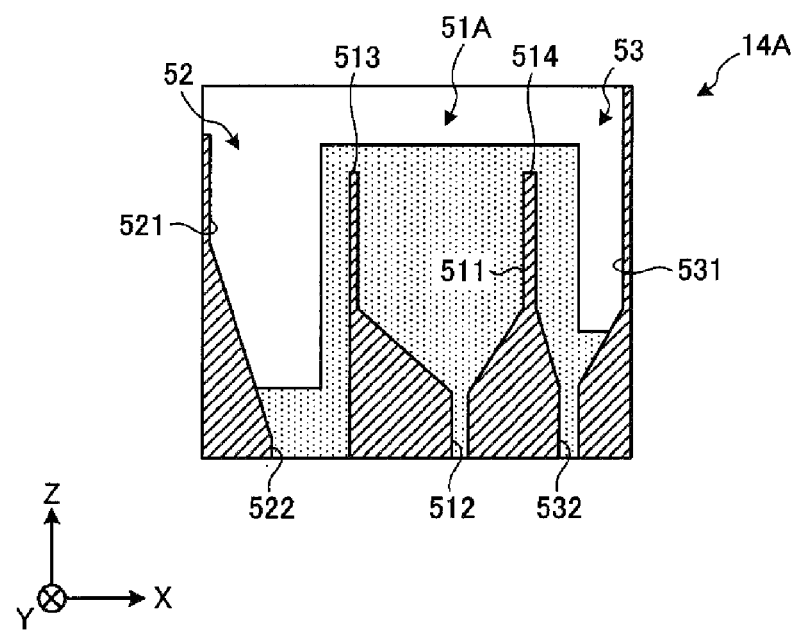
FIG. 12 is a schematic view illustrating a configuration of a nozzle cleaning device according to a first modified embodiment of the first exemplary embodiment.

In the above-mentioned example, the cleaning liquid overflows only to the overflow bath 52. However, the cleaning liquid may also overflow to the dummy dispensing path 53. In this regard, descriptions will be made with reference to FIG. 12. FIG. 12 is a schematic view illustrating a configuration of a nozzle cleaning device according to a first modified embodiment of the first exemplary embodiment.

As illustrated in FIG. 12, a nozzle cleaning device 14A according to the first modified embodiment is provided with a cleaning bath 51A instead of the above-mentioned cleaning bath 51. The cleaning bath 51A is also provided with an overflow portion 514 in the upper portion of the dummy dispensing bath 53 side. The cleaning liquid exceeding a predetermined level is discharged from the overflow portion 514 to the dummy dispensing bath 53 as well.

Therefore, when the cleaning liquid is allowed to overflow even to the dummy dispensing bath 53, in other words, when the dummy dispensing bath 53 is used as an overflow bath, it is possible to clean the dummy dispensing bath with the overflowing cleaning liquid.

Figure 13:
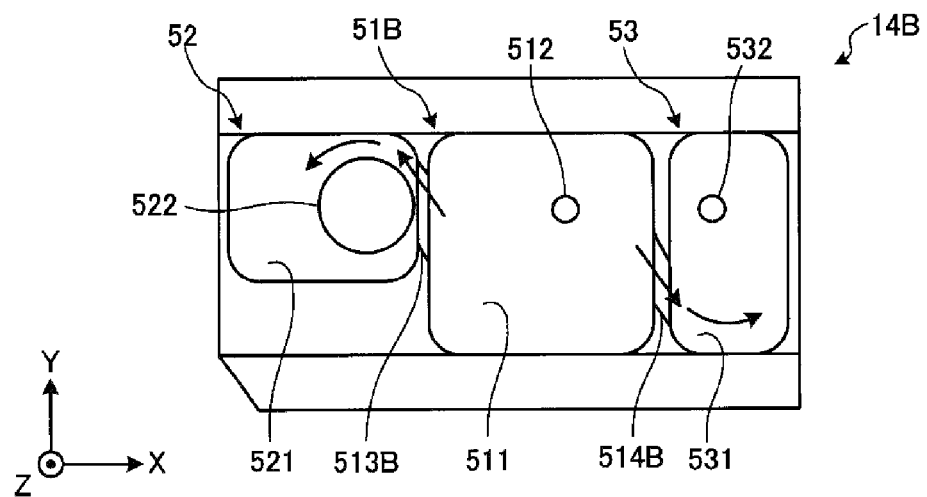
FIG. 13 is a schematic view illustrating a configuration of a nozzle cleaning device according to a second modified embodiment of the first exemplary embodiment.

The overflow portion may be configured such that the overflow bath 52 and the dummy dispensing bath 53 are cleaned efficiently by the cleaning liquid. In this regard, descriptions will be made with reference to FIG. 13. FIG. 13 is a schematic view illustrating the configuration of a nozzle cleaning device according to a second modified embodiment of the first exemplary embodiment.

As illustrated in FIG. 13, a nozzle cleaning device 14B according to the second modified embodiment is provided with a cleaning bath 51B instead of the above-mentioned cleaning bath 51. The cleaning bath 51B is provided with overflow portions 513B, 514B at the overflow bath 52 side and the dummy dispensing bath 53 side, respectively, as in the cleaning bath 51A according to the first modified embodiment.

These overflow portions 513B, 514B form flow paths for allowing the overflowing cleaning liquid to flow at an angle to the vertical direction (Z-axis direction). Therefore, the cleaning liquid flowing into the overflow bath 52 and the dummy dispensing bath 53 through the overflow portions 513B, 514B, respectively, is not discharged immediately from the discharge ports 522, 532, but discharged while turning in the overflow bath 52 and the dummy dispensing bath 53.

With such a configuration, the overflowing cleaning liquid easily stays in the overflow bath 52 and the dummy dispensing bath 53. Thus, it is possible to efficiently clean the overflow bath 52 and the dummy dispensing bath 53 with the overflowing cleaning liquid.

Second Exemplary Embodiment

In the above-mentioned first exemplary embodiment, descriptions have been made on a case where the overflow bath 52 and the dummy dispensing bath 53 are disposed at both sides of the cleaning bath 51. However, the disposition of the dummy dispensing bath is not limited to the example as described in the first exemplary embodiment. Hereinafter, another disposition example of the dummy dispensing bath will be described.

Figure 14:
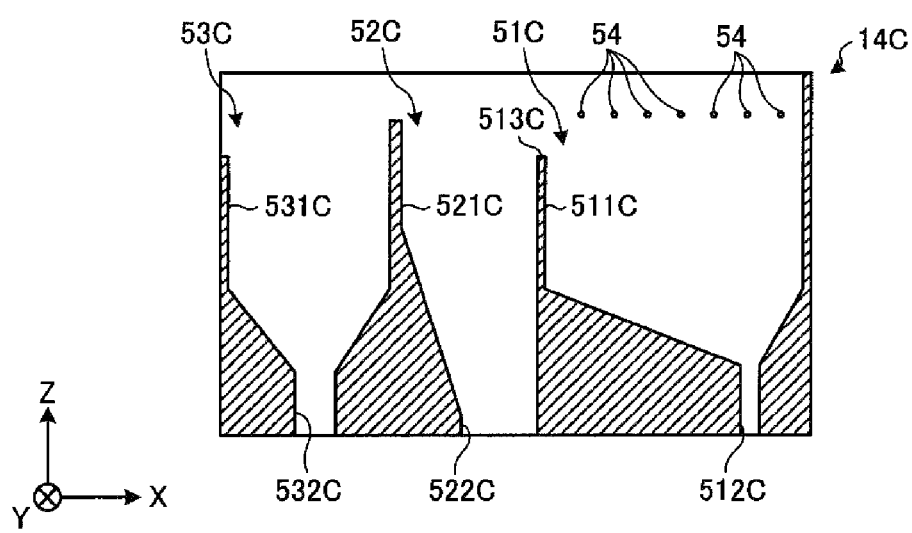
FIG. 14 is a schematic view illustrating a configuration of a nozzle cleaning device according to a second exemplary embodiment.

FIG. 14 is a schematic view illustrating a configuration of a nozzle cleaning device according to a second exemplary embodiment. In the following description, the same reference numerals are given to the same parts as those which have already been described, and the overlapping description is omitted.

As illustrated in FIG. 14, a nozzle cleaning device 14C according to the second exemplary embodiment is provided with a cleaning bath 51C, an overflow bath 52C and a dummy dispensing bath 53C.

In the nozzle cleaning device 14C according to the second exemplary embodiment, the dummy dispensing bath 53C is disposed adjacent to the overflow bath 52C. Specifically, the cleaning bath 51C, the overflow bath 52C, and the dummy dispensing bath 53C are disposed side by side in the order of the dummy dispensing bath 53C, the overflow bath 52C, and the cleaning bath 51C in the positive X-axis direction.

The cleaning bath 51C is provided with a liquid storage portion 511C, a discharge port 512C, and an overflow portion 513C. Unlike the liquid storage portion 511 according to the first exemplary embodiment, the liquid storage portion 511C is formed to have a size capable of accommodating a first nozzle 134, a second nozzle 135, and a third nozzle 136 at the same time. The discharge port 512C is provided in the lower end of the liquid storage portion 511C. The overflow portion 513C is provided in the upper end of the overflow bath 52C side.

The overflow bath 52C is provided with a liquid storage portion 521C and a discharge port 522C, as in the overflow bath 52 according to the first exemplary embodiment, and receives a cleaning liquid flowing from the overflow portion 513C and discharges the cleaning liquid from the discharge port 522C.

The dummy dispensing bath 53C is provided with a liquid storage portion 531C and a discharge port 532C. Unlike the liquid storage portion 531 according to the first exemplary embodiment, the liquid storage portion 531C is formed to have a size capable of accommodating the first nozzle 134 and the second nozzle 135 at the same time. The discharge port 532C is provided in the lower portion of the liquid storage portion 531C.

Next, a specific operation of the nozzle cleaning device 14C according to the second exemplary embodiment will be described with reference to FIGS. 15A to 15E. FIGS. 15A to 15E are schematic views illustrating an operation example of a nozzle cleaning processing and a dummy dispensing processing according to the second exemplary embodiment.

Figure 15A:
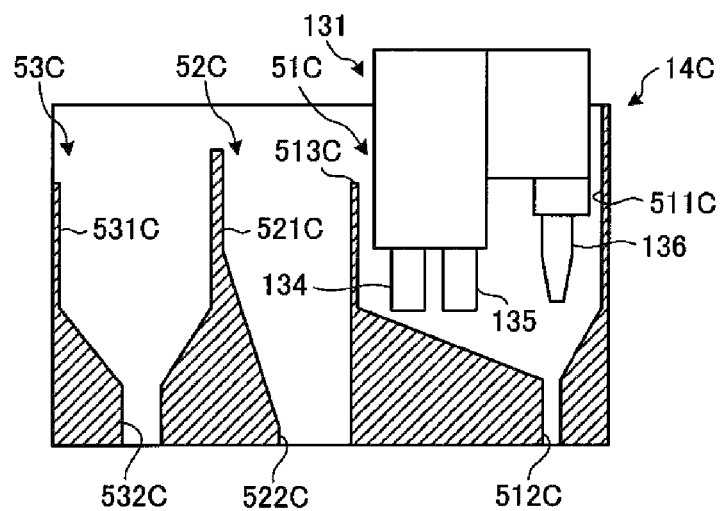
FIG. 15A is a schematic view illustrating an operation example of a nozzle cleaning processing and a dummy dispensing processing according to the second exemplary embodiment.
Figure 15B:
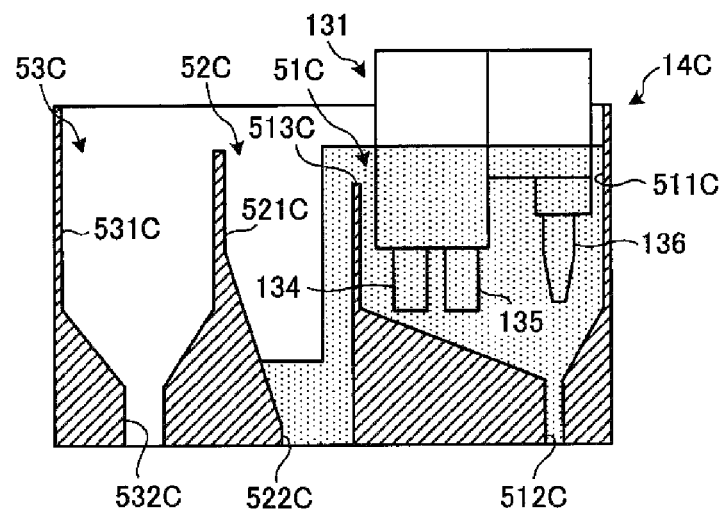
FIG. 15B is a schematic view illustrating an operation example of the nozzle cleaning processing and the dummy dispensing processing according to the second exemplary embodiment.
Figure 15C:
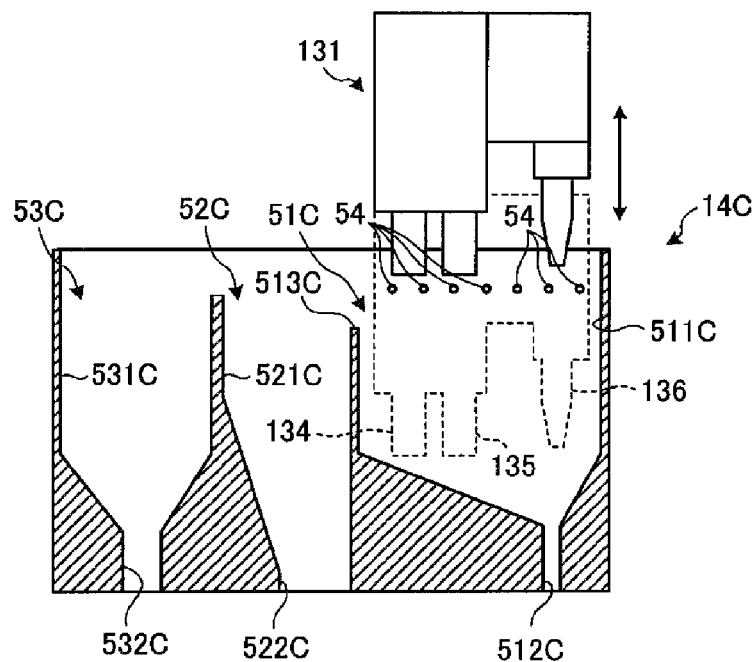
FIG. 15C is a schematic view illustrating an operation example of the nozzle cleaning processing and the dummy dispensing processing according to the second exemplary embodiment.

First, the control unit 101 (see FIG. 1) controls the moving mechanism 133 (see FIG. 2) to move the nozzle head 131 such that the first nozzle 134, the second nozzle 135 and the third nozzle 136 are disposed in the liquid storage portion 511C of the cleaning bath 51C as illustrated in FIG. 15A.

Subsequently, the control unit 101 opens the valve 204 (see FIG. 6) to supply the cleaning liquid from the cleaning liquid supply unit 55 to the liquid storage portion 511C of the cleaning bath 51C. Therefore, the cleaning liquid is stored in the liquid storage portion 511C, and the first nozzle 134, the second nozzle 135 and the third nozzle 136 disposed in the liquid storage portion 511C are immersed in the cleaning liquid (see FIG. 15B).

Accordingly, the nozzle cleaning device 14C immerses and cleans the first nozzle 134, the second nozzle 135 and the third nozzle 136 at the same time. At this time, the cleaning liquid exceeding a predetermined level in the liquid storage portion 511C is discharged from the overflow portion 513C to the overflow bath 52C.

After a predetermined time elapses from the opening of the valve 204, the control unit 101 closes the valve 204. Thus, all the cleaning liquid in the liquid storage portion 511C is discharged from the discharge port 512C.

Subsequently, the control unit 101 opens the valve 205 (see FIG. 6) to eject the gas from the gas supply unit 54. And, the control unit 101 controls the moving mechanism 133 to move the nozzle head 131 up and down (see FIG. 15C). Therefore, the first nozzle 134, the second nozzle 135, and the third nozzle 136 are dried.

Thereafter, the control unit 101 closes the valve 205 to stop the supply of the gas from the gas supply unit 54, and finishes the nozzle cleaning processing.

Figure 15D:
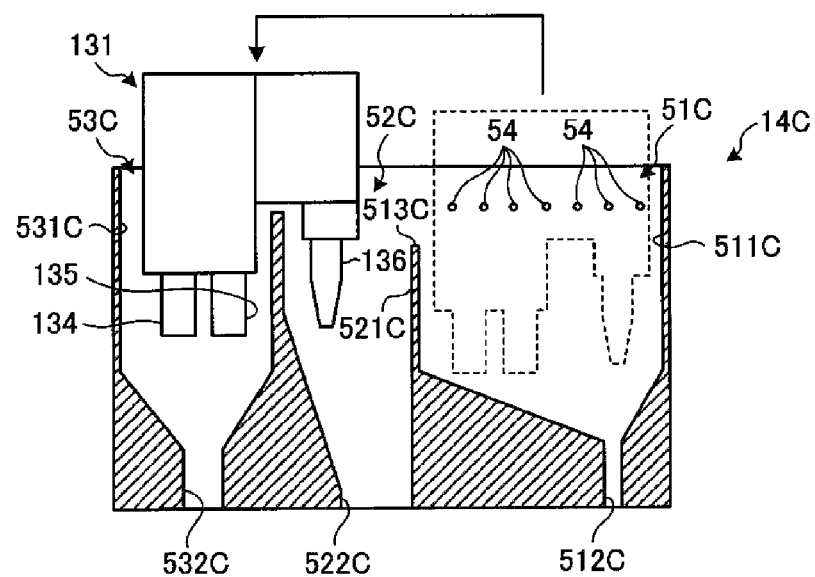
FIG. 15D is a schematic view illustrating an operation example of the nozzle cleaning processing and the dummy dispensing processing according to the second exemplary embodiment.

Subsequently, when the dummy dispensing processing is performed, the control unit 101 controls the moving mechanism 133 to move the nozzle head 131 such that the first nozzle 134 and the second nozzle 135 are disposed in the dummy dispensing bath 53C and the third nozzle 136 is disposed in the overflow bath 52C (see FIG. 15D).

Then, the control unit 101 opens the valves 201 to 203 for a predetermined time to eject the processing liquids from the first nozzle 134, the second nozzle 135 and the third nozzle 136 for a predetermined time. The processing liquids ejected from the first nozzle 134 and the second nozzle 135 are accommodated in the dummy dispensing bath 53C and discharged from the discharge port 532C of the dummy dispensing bath 53C to the outside of the substrate processing apparatus 42. Further, the processing liquid ejected from the third nozzle 136 is accommodated in the overflow bath 52C and discharged from the discharge port 522C of the overflow bath 52C to the outside of the substrate processing apparatus 42 (see, FIG. 15E).

Figure 15E:
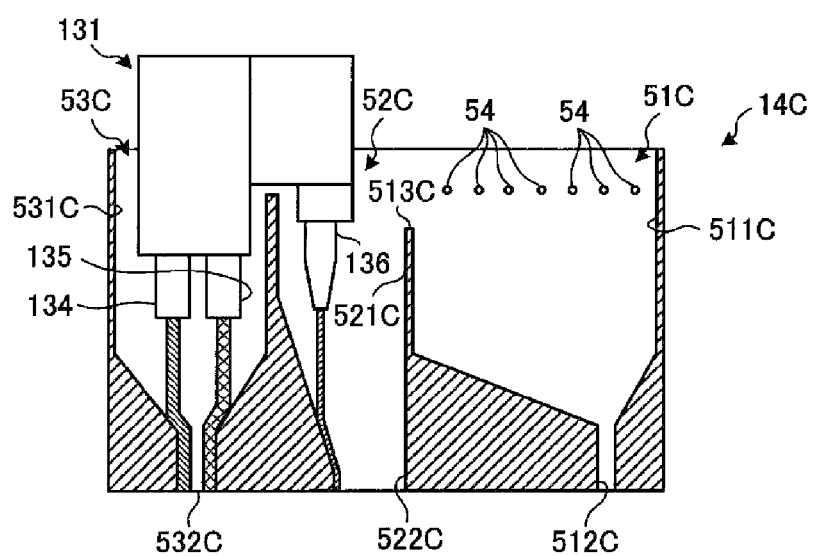
FIG. 15E is a schematic view illustrating an operation example of the nozzle cleaning processing and the dummy dispensing processing according to the second exemplary embodiment.

Further, in the first exemplary embodiment, the processing liquid is ejected to the dummy dispensing bath 53 from one nozzle (the third nozzle 136). In contrast, in the second exemplary embodiment, the processing liquid is ejected to the dummy dispensing bath 53C from two nozzles (the first nozzle 134 and the second nozzle 135). Thus, as illustrated in FIG. 15E, the discharge port 532C of the dummy dispensing bath 53C according to the second exemplary embodiment has a larger diameter than that of the discharge port 531 of the dummy dispensing bath 53 according to the first exemplary embodiment. Therefore, it is possible to suppress liquid residues during the dummy dispensing processing.

As described above, according to the nozzle cleaning device 14C of the second exemplary embodiment, the dummy dispensing processing of the first nozzle 134 and the second nozzle 135 (corresponding to an example of "the first nozzle" in the second exemplary embodiment) and the dummy dispensing processing of the third nozzle 136 (corresponding to an example of "the second nozzle" in the first exemplary embodiment) may be performed at the same time by providing the dummy dispensing bath 53C adjacent to the overflow bath 52C. Thus, it is possible to reduce the time required for the dummy dispensing processing.

Further, since the nozzle cleaning device 14C according to the second exemplary embodiment is provided with the liquid storage portion 511C capable of accommodating the first nozzle 134, the second nozzle 135, and the third nozzle 136 at the same time, it is possible to reduce the time required for the nozzle cleaning processing.

Further, the configuration of the cleaning bath 51C according to the second exemplary embodiment may be applied to the nozzle cleaning devices 14, 14A, 14B according to the first exemplary embodiment.

Third Exemplary Embodiment

The respective exemplary embodiments as described above have been described with respect to an example of a case where the nozzle cleaning device is provided with a dummy dispensing bath separately from an overflow bath. However, for example, in a case where mixing of processing liquids are not problematic, the nozzle cleaning device is not necessarily provided with a dummy dispensing bath. Accordingly, hereinafter, descriptions will be made on a nozzle cleaning device which is not provided with a dummy dispensing bath.

Figure 16:
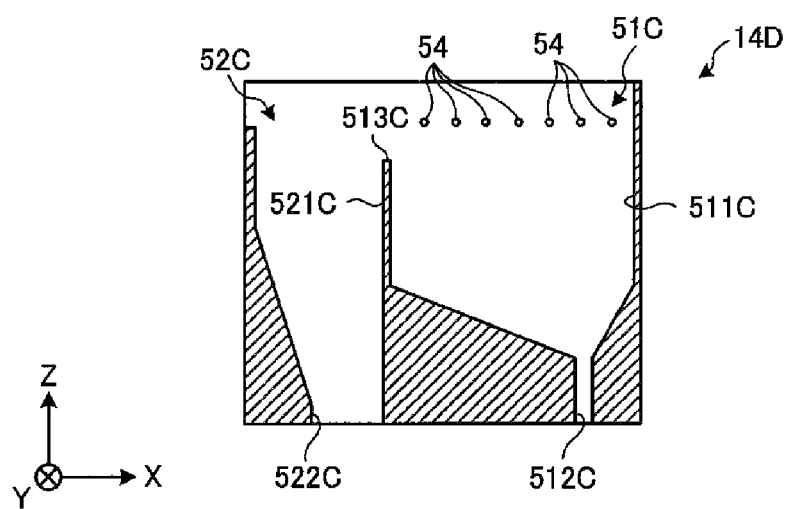
FIG. 16 is a schematic view illustrating a configuration of a nozzle cleaning device according to a third exemplary embodiment.

FIG. 16 is a schematic view illustrating a configuration of a nozzle cleaning device according to the third exemplary embodiment. In the following description, the same reference numerals are given to the same parts as those which have already been described, and the overlapping description is omitted.

As illustrated in FIG. 16, a nozzle cleaning device 14D according to the third exemplary embodiment has a configuration in which the dummy dispensing bath 53C is removed from the nozzle cleaning device 14D according to the second exemplary embodiment. Specifically, the nozzle cleaning device 14D is provided with a cleaning bath 51C and an overflow bath 52C.

Figure 17A:
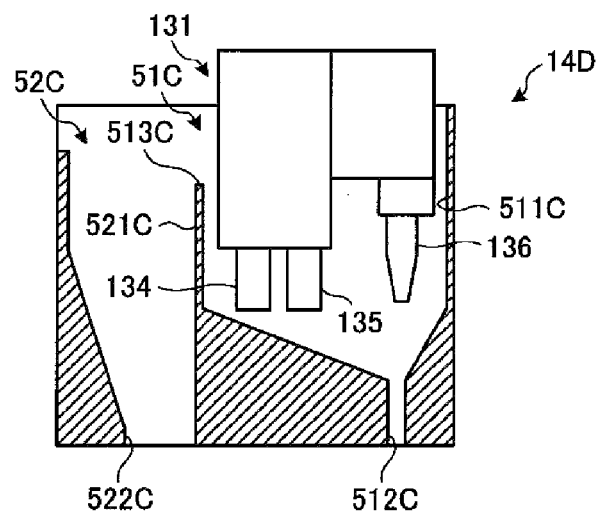
FIG. 17A is a schematic view illustrating an operation example of a nozzle cleaning processing and a dummy dispensing processing according to the third exemplary embodiment.
Figure 17B:
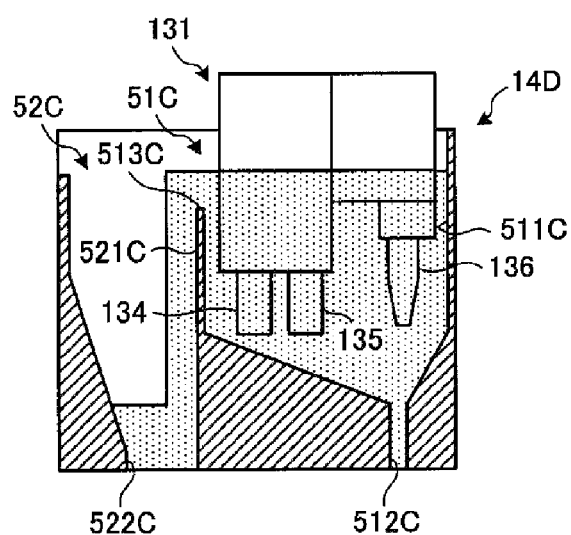
FIG. 17B is a schematic view illustrating an operation example of the nozzle cleaning processing and the dummy dispensing processing according to the third exemplary embodiment.
Figure 17C:
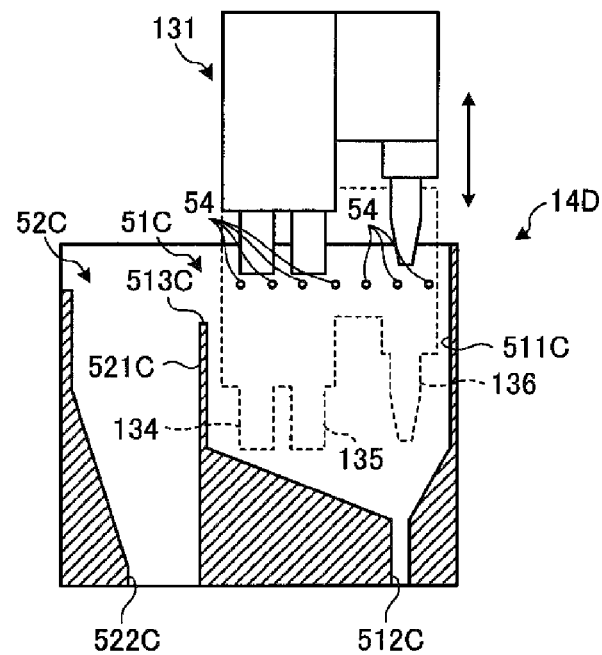
FIG. 17C is a schematic view illustrating an operation example of the nozzle cleaning processing according to the third exemplary embodiment.

Next, a specific operation of the nozzle cleaning device 14D according to the third exemplary embodiment will be described with reference to FIGS. 17A to 17E. FIGS. 17A to 17E are schematic views illustrating an operation example of a nozzle cleaning processing and a dummy dispensing processing according to the third exemplary embodiment. Further, since the operations of the nozzle cleaning processing as illustrated in FIGS. 17A to 17C are the same as those illustrated in FIGS. 15A to 15C, the descriptions thereof will be omitted.

Figure 17D:
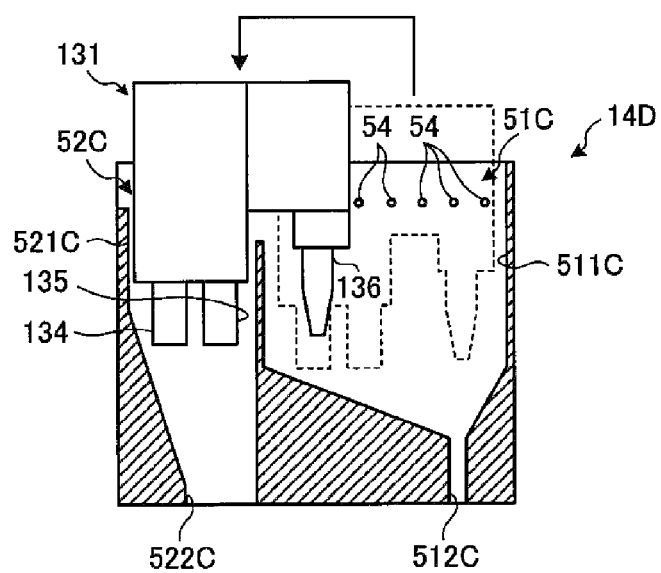
FIG. 17D is a schematic view illustrating an operation example of the nozzle cleaning processing according to the third exemplary embodiment.
Figure 17E:
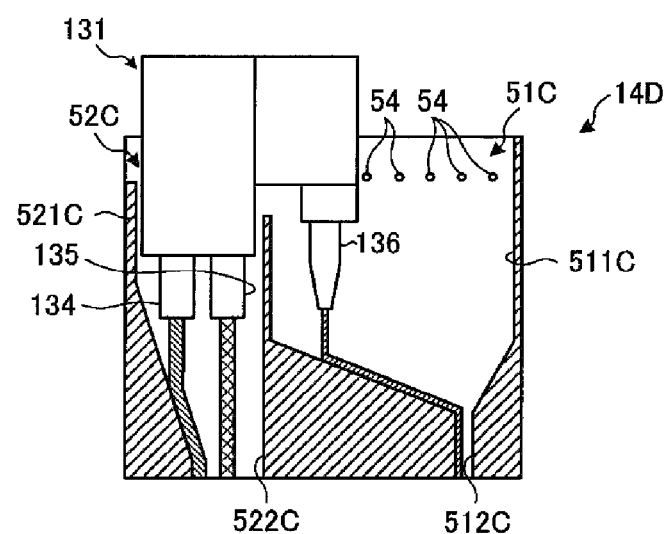
FIG. 17E is a schematic view illustrating an operation example of the nozzle cleaning processing according to the third exemplary embodiment.

When performing a dummy dispensing processing, the control unit 101 controls the moving mechanism 133 to move the nozzle head 131 such that the first nozzle 134 and the second nozzle 135 are disposed in the overflow bath 52C and the third nozzle 136 is disposed in the cleaning bath 51C (see FIG. 17D).

Then, the control unit 101 opens the valves 201 to 203 for a predetermined time to eject the processing liquids from the first nozzle 134, the second nozzle 135 and the third nozzle 136 for a predetermined time. The processing liquids ejected from the first nozzle 134 and the second nozzle 135 are accommodated in the overflow bath 52C and discharged from the discharge port 522C of the overflow bath 52C to the outside of the substrate processing apparatus 42. Further, the processing liquid ejected from the third nozzle 136 is accommodated in the cleaning bath 51C and discharged from the discharge port 512C of the overflow bath 51C to the outside of the substrate processing apparatus 42 (see FIG. 17E).

As described above, since the nozzle cleaning device 14D uses the cleaning bath 51C as a dummy dispensing bath for the third nozzle 136, it is possible to further facilitate miniaturization of the device.

Fourth Exemplary Embodiment

Figure 18A:
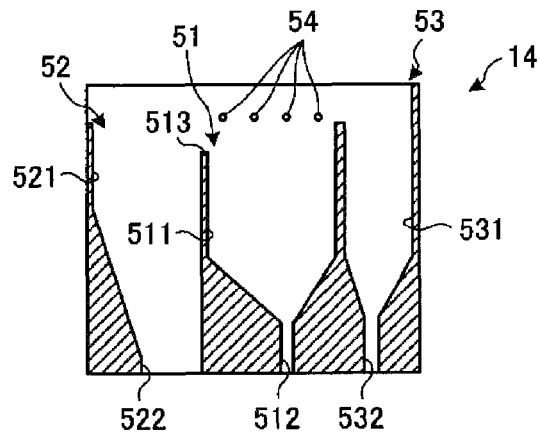
FIG. 18A is a schematic view illustrating an operation example of a bath cleaning processing.
Figure 18B:
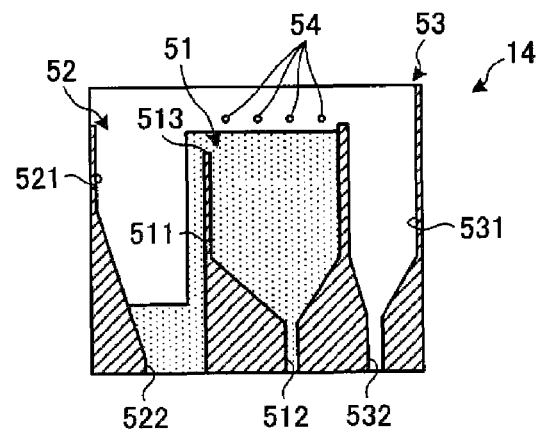
FIG. 18B is a schematic view illustrating an operation example of the bath cleaning processing.
Figure 18C:
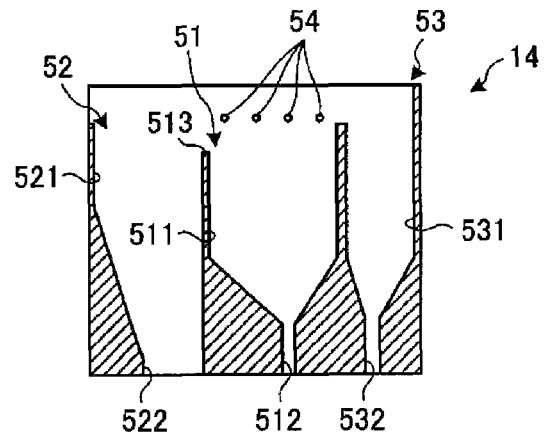
FIG. 18C is a schematic view illustrating an operation example of the bath cleaning processing.

The nozzle cleaning device may perform a bath cleaning processing of cleaning the cleaning bath 51 itself before performing the nozzle cleaning processing. In this regard, descriptions will be made with reference to FIGS. 18A to 18C. FIGS. 18A to 18C are schematic views illustrating an operation example of a bath cleaning processing. Here, the bath cleaning processing will be exemplified with the nozzle cleaning device 14 according to the first exemplary embodiment. However, the bath cleaning processing may also be performed in other nozzle cleaning devices 14A to 14D.

As illustrated in FIG. 18A, the bath cleaning processing is performed before the nozzle head 131 is disposed in the cleaning bath 51 in the nozzle cleaning processing (that is, prior to the state as illustrated in FIG. 9A). In this state, the control unit 101 first opens valve 205 (see FIG. 6) to eject gas from the gas supply unit 54. Thus, when dust is present in the gas supply unit 54, the dust may be discharged from the gas supply unit 54. Further, the opening time of the valve 205 is, for example, 30 seconds. After a predetermined time elapses from the opening of the valve 205, the control unit 101 closes the valve 205.

Subsequently, the control unit 101 opens the valve 204 (see FIG. 6) to supply the cleaning liquid from the cleaning liquid supply unit 55 to the liquid storage portion 511 of the cleaning bath 51. Therefore, the cleaning liquid is stored in the liquid storage portion 511. Further, the cleaning liquid exceeding a predetermined level in the liquid storage portion 511 overflows from the overflow portion 513 to the overflow bath 52 and is discharged from the discharge port 522 of the overflow bath 52 to the outside of the substrate processing apparatus 42 (see FIG. 18B). Further, the opening time of the valve 205 is, for example, 30 seconds.

Then, after a predetermined time elapses from the opening of the valve 204, the control unit 101 closes the valve 204. Thus, all the cleaning liquid in the liquid storage portion 511 is discharged from the discharge port 512, and the bath cleaning processing is terminated (see FIG. 18C). Thereafter, the control 101 starts the nozzle cleaning processing as illustrated in FIGS. 9A to 9G.

Therefore, when the bath cleaning processing is performed, even if contaminants removed from the nozzle head 131 in the last nozzle cleaning processing remain in the cleaning bath 51 or the cleaning liquid supply unit 55 (see FIG. 6), such contaminants may be removed before the nozzle cleaning processing. Accordingly, it is possible to suppress re-attachment of the contaminants to the nozzle head 131 in the subsequent nozzle cleaning processing.

Further, in the above-mentioned examples, the cleaning liquid is stored in the cleaning bath 51 and overflows therefrom after gas is ejected from the gas supply unit 54. However, the processing of ejecting gas from the gas supply unit 54 may be performed after, or before and after the processing of storing the cleaning liquid in the cleaning bath 51 and allowing the cleaning liquid to overflow therefrom.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a first nozzle configured to eject a first processing liquid to a substrate;
   a second nozzle configured to eject a second processing liquid to the substrate;
   a moving mechanism configured to move the first and second nozzles;
   a nozzle cleaning device configured to clean at least one of the first nozzle and the second nozzle; and
   a controller configured to control an overall operation of the substrate processing apparatus,
   wherein the nozzle cleaning device includes:
      a cleaning bath provided with a liquid storage portion configured to store a cleaning liquid for cleaning at least one of the first nozzle and the second nozzle, and an overflow portion configured to discharge the cleaning liquid exceeding a predetermined level from the liquid storage portion;
      an overflow bath disposed adjacent to the cleaning bath and configured to receive the cleaning liquid discharged from the overflow portion and discharge the received cleaning liquid to the outside; and
      a dummy dispensing bath disposed adjacent to the cleaning bath and configured to receive the first processing liquid ejected from the first nozzle and discharge the received first processing liquid,
   wherein the overflow bath is provided at a position where the second nozzle is disposed when the first nozzle is disposed in the liquid storage portion of the cleaning bath,
   the controller is programmed to control the substrate processing apparatus such that:
      when cleaning the first nozzle and the second nozzle, the first nozzle and the second nozzle are immersed in the cleaning liquid in the liquid storage portion of the cleaning bath, respectively,
      when performing a dummy dispensing process of ejecting the first processing liquid from the first nozzle, the first processing liquid is ejected from the first nozzle into the dummy dispensing bath,
      when performing a dummy dispensing process of ejecting the second processing liquid from the second nozzle, second processing liquid is ejected from the second nozzle into the overflow bath, and
      when ejecting the second processing liquid from the second nozzle into the overflow bath, the first nozzle is disposed in the liquid storage portion of the cleaning bath.

2. The substrate processing apparatus of claim 1, wherein the overflow bath receives the second processing liquid ejected from the second nozzle and discharges the received second processing liquid.

3. The substrate processing apparatus of claim 2, wherein the dummy dispensing bath is provided at a position where the first nozzle is disposed when the second nozzle is disposed in the liquid storage portion of the cleaning bath.

4. The substrate processing apparatus of claim 2, wherein the cleaning bath further includes a dummy dispensing bath side overflow portion configured to discharge the cleaning liquid exceeding the predetermined level from the liquid storage portion of the cleaning bath to the dummy dispensing bath.

5. The substrate processing apparatus of claim 2, wherein the liquid storage portion of the cleaning bath is formed to have a size capable of accommodating the first nozzle and the second nozzle at the same time.

6. The substrate processing apparatus of claim 1, further comprising:
a cleaning liquid supply unit configured to supply the cleaning liquid into the liquid storage portion,
wherein the liquid storage portion is provided with a first inner peripheral portion having an inner dimension which is constant from an upper end to a lower end of the first inner peripheral portion, and a second inner peripheral portion having an upper end and a lower end, the upper end being connected to the lower portion of the first inner peripheral portion, and a diameter of the second inner peripheral portion being gradually reduced from the upper end to the lower end of the second inner peripheral portion, and
the cleaning liquid supply unit forms a swirling flow in the liquid storage portion by ejecting the cleaning liquid towards a position deviated from the center of the first inner peripheral portion when viewed from above.

7. The substrate processing apparatus of claim 6, wherein the cleaning bath further includes a discharge port configured to discharge the cleaning liquid stored in the liquid storage portion, in the lower end of the second inner peripheral portion, and
the discharge port is disposed at a position deviated from the center of the first inner peripheral portion when viewed from above.

8. The substrate processing apparatus of claim 1, wherein, before cleaning at least one of the first nozzle and the second nozzle, the liquid storage portion is cleaned by supplying the cleaning liquid into the liquid storage portion of the cleaning bath, and discharging the cleaning liquid exceeding the predetermined level from the liquid storage portion to the overflow portion.

9. The substrate processing apparatus of claim 2, wherein the cleaning bath is provided with an additional overflow portion configured to discharge the cleaning liquid exceeding a predetermined level from the addition overflow portion to the dummy dispensing bath.

10. The substrate processing apparatus of claim 2, wherein the dummy dispensing bath is disposed adjacent to the overflow bath such that the cleaning bath, the overflow bath, and the dummy dispensing bath are disposed side by side in an order of the dummy dispensing bath, the overflow bath, and the cleaning bath in a positive X-axis direction.

11. The substrate processing apparatus of claim 2, wherein the dummy dispensing bath is provided adjacent to the overflow bath such that the dummy dispensing process of the first nozzle and the dummy dispensing process of the second nozzle is performed at the same time.

12. A nozzle cleaning method, comprising:
moving a second nozzle that ejects a second processing liquid to a substrate into a liquid storage portion of a cleaning bath provided with the liquid storage portion configured to store a cleaning liquid for cleaning the second nozzle, and an overflow portion configured to discharge the cleaning liquid exceeding a predetermined level from the liquid storage portion;
immersing the second nozzle in the cleaning liquid stored in the liquid storage portion of the cleaning bath in order to clean the second nozzle;
after the immersing the second nozzle, moving the second nozzle to an overflow bath disposed adjacent to the cleaning bath and configured to receive the cleaning liquid discharged from the overflow portion and discharge the received cleaning liquid to the outside such that a first nozzle is disposed in the liquid storage portion of the cleaning bath;
after moving the second nozzle to the overflow bath, immersing the first nozzle in the cleaning liquid stored in the liquid storage portion of the cleaning bath in order to clean the first nozzle;
after the immersing the first nozzle, moving the first nozzle to a dummy dispensing bath configured to receive a first processing liquid discharged from the first nozzle and discharge the received first processing liquid;
after moving the first nozzle to the dummy dispensing bath, performing a dummy dispensing process of ejecting the first processing liquid from the first nozzle into the dummy dispensing bath;
after performing the dummy dispensing process of ejecting the first processing liquid, performing, moving the second processing nozzle to the overflow bath; and
after moving the second processing nozzle to the overflow bath, performing a dummy dispensing process of ejecting the second processing liquid from the second nozzle into the overflow bath.

13. The nozzle cleaning method of claim 12, further comprising:
before moving the second nozzle into a liquid storage portion of a cleaning bath, cleaning the liquid storage portion by supplying the cleaning liquid into the liquid storage portion of the cleaning bath and discharging the cleaning liquid exceeding a predetermined level from the liquid storage portion to the overflow portion.

* * * * *